United States Patent
Chen et al.

(10) Patent No.: US 12,289,883 B2
(45) Date of Patent: Apr. 29, 2025

(54) ONE TIME PROGRAMMING MEMORY CELL WITH FIN FIELD-EFFECT TRANSISTOR USING PHYSICALLY UNCLONABLE FUNCTION TECHNOLOGY

(71) Applicant: eMemory Technology Inc., Hsinchu (TW)

(72) Inventors: Lun-Chun Chen, Hsinchu County (TW); Ping-Lung Ho, Hsinchu County (TW)

(73) Assignee: EMEMORY TECHNOLOGY INC., Hsin-Chu (TW)

(*) Notice: Subject to any disclaimer, the term of this patent is extended or adjusted under 35 U.S.C. 154(b) by 188 days.

(21) Appl. No.: 18/219,864

(22) Filed: Jul. 10, 2023

(65) Prior Publication Data
US 2024/0021256 A1   Jan. 18, 2024

Related U.S. Application Data

(60) Provisional application No. 63/388,258, filed on Jul. 12, 2022.

(51) Int. Cl.
*G11C 5/02* (2006.01)
*G11C 16/24* (2006.01)
*G11C 16/26* (2006.01)
*G11C 17/16* (2006.01)
*H01L 23/00* (2006.01)
(Continued)

(52) U.S. Cl.
CPC ............ *H10B 20/25* (2023.02); *G11C 16/24* (2013.01); *G11C 16/26* (2013.01); *G11C 17/16* (2013.01); *H01L 23/576* (2013.01); *H02H 9/02* (2013.01)

(58) Field of Classification Search
CPC .......... G11C 5/025; G11C 5/04; G11C 5/063; G11C 11/4097; G11C 7/18
USPC ...................................... 365/51, 63
See application file for complete search history.

(56) References Cited

U.S. PATENT DOCUMENTS 9,589,970 B1 * 3/2017 Tseng .................... H10B 20/25
9,613,714 B1   4/2017 Wong
(Continued)

FOREIGN PATENT DOCUMENTS

CA   2952941 A1   7/2017
EP   3196888 B1   12/2019

OTHER PUBLICATIONS

Office Action issued by Taiwan Intellectual Property Office on Dec. 22, 2023.

*Primary Examiner* — Son T Dinh
(74) *Attorney, Agent, or Firm* — WPAT, PC

(57) ABSTRACT

An OTP memory cell includes an antifuse transistor, a first transistor and a second transistor. The antifuse transistor includes a first fin, a second fin, a first gate structure, a first drain/source contact layer and a second drain/source contact layer. A central region of the first fin and a central region of the second fin are covered by a first gate structure. The first drain/source contact layer is electrically connected with a first terminal of the first fin and a first terminal of the second fin. The second drain/source contact layer is electrically connected with a second terminal of the second fin but not electrically connected with a second terminal of the first fin. The first transistor is connected with the first drain/source contact layer. The second transistor is connected with the second drain/source contact layer.

36 Claims, 15 Drawing Sheets

(51) Int. Cl.
*H02H 9/02* (2006.01)
*H10B 20/25* (2023.01)

(56) References Cited

U.S. PATENT DOCUMENTS 10,840,148 B1 * 11/2020 Cheng .................... H10B 63/34
2021/0320190 A1   10/2021 Cheng et al.

* cited by examiner

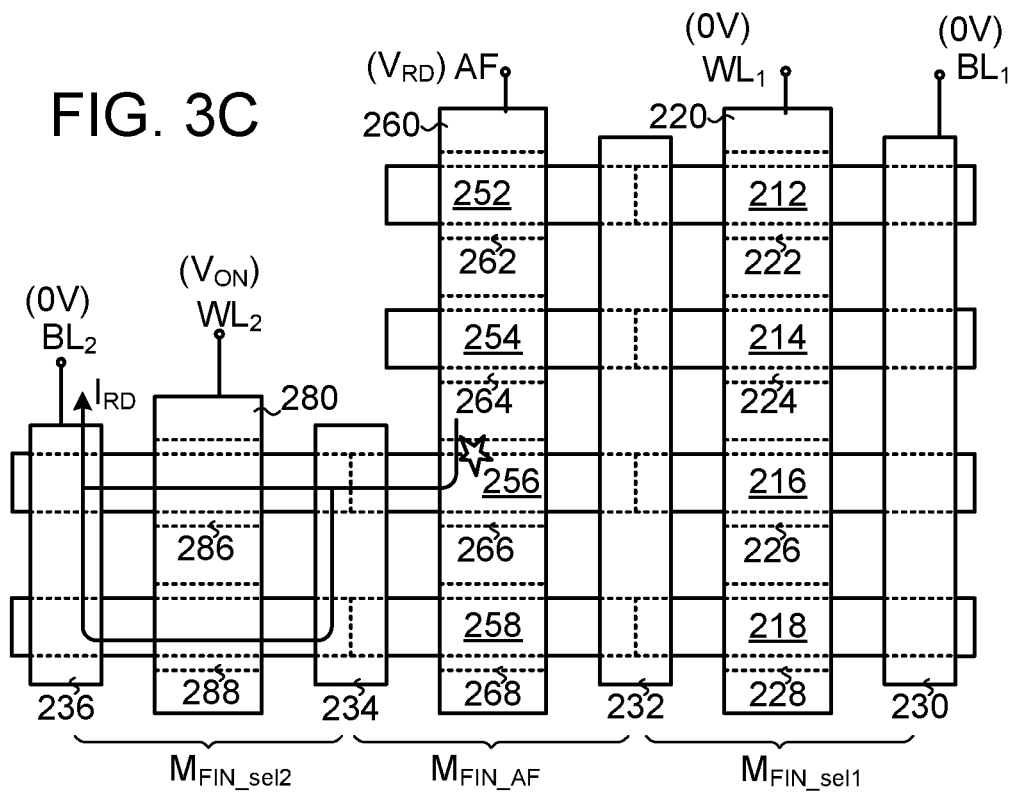
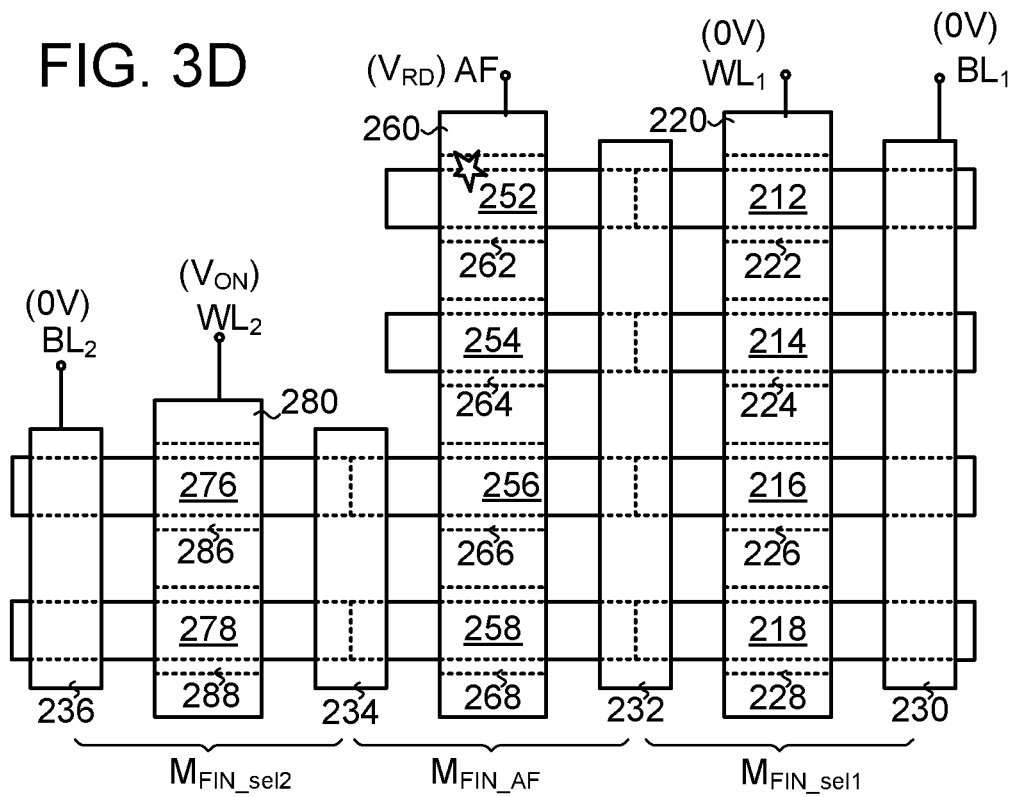

ONE TIME PROGRAMMING MEMORY CELL WITH FIN FIELD-EFFECT TRANSISTOR USING PHYSICALLY UNCLONABLE FUNCTION TECHNOLOGY

This application claims the benefit of U.S. provisional application Ser. No. 63/388,258, filed Jul. 12, 2022, the subject matter of which is incorporated herein by references.

FIELD OF THE INVENTION

The present invention relates to a memory cell of a non-volatile memory, and more particularly to a one time programming memory cell (OTP memory cell) with FinFET transistors by using a physically unclonable function (PUF) technology.

BACKGROUND OF THE INVENTION

As is well known, a one time programming memory (also referred as an OTP memory) is one of the non-volatile memories. The OTP memory comprises plural one time programming memory cells (also referred as OTP memory cells). The OTP memory cell can be programmed once. After the OTP memory cell is programmed, the stored data fails to be modified.

A physically unclonable function (PUF) technology is a novel method for protecting the data of a semiconductor chip. That is, the use of the PUF technology can prevent the data of the semiconductor chip from being stolen. In accordance with the PUF technology, the semiconductor chip is capable of providing a random code. This random code is used as a unique identity code (ID code) of the semiconductor chip to achieve the protecting function.

Generally, the PUF technology acquires the unique random code of the semiconductor chip according to the manufacturing variation of the semiconductor chip. This manufacturing variation includes the semiconductor process variation. That is, even if the PUF semiconductor chip is produced by a precise manufacturing process, the random code cannot be duplicated. Consequently, the semiconductor chip using the PUF technology is suitably used in the applications with high security requirements.

For example, U.S. Pat. No. 9,613,714 disclosed a one time programming memory cell and a memory array for a PUF technology and an associated random code generating method.

SUMMARY OF THE INVENTION

An embodiment of the present invention provides a one time programming (OTP) memory cell using a physically unclonable function technology. The OTP memory cell includes a first fin, a second fin, a first gate structure, a first drain/source contact layer, a second drain/source contact layer, a first transistor and a second transistor. The first gate structure includes a first gate dielectric layer, a second gate dielectric layer and a first gate layer. A top surface and two lateral surfaces of a central region of the first fin are covered by the first gate dielectric layer. A top surface and two lateral surfaces of a central region of the second fin are covered by the second gate dielectric layer. The first gate dielectric layer and the second gate dielectric layer are covered by the first gate layer. The first gate layer is connected with an antifuse control line. The first drain/source contact layer is electrically connected with a first terminal of the first fin and a first terminal of the second fin. The second drain/source contact layer is electrically connected with a second terminal of the second fin. The second drain/source contact layer is not electrically connected with a second terminal of the first fin. The first transistor includes a first drain/source terminal, a gate terminal and a second drain/source terminal. The second drain/source terminal of the first transistor is connected with the first drain/source contact layer. The second transistor includes a first drain/source terminal, a gate terminal and a second drain/source terminal. The first drain/source terminal of the second transistor is connected with the second drain/source contact layer.

Another embodiment of the present invention provides a one time programming (OTP) memory cell using a physically unclonable function technology. The OTP memory cell includes a first drain/source contact layer, a first fin, a second fin, a first gate structure, a second drain/source contact layer, a third fin, a fourth fin, a second gate structure, a third drain/source contact layer, a fifth fin and a third gate structure. A first terminal of the first fin is electrically connected with the first drain/source contact layer. A first terminal of the second fin is electrically connected with the first drain/source contact layer. The first gate structure includes a first gate dielectric layer, a second gate dielectric layer and a first gate layer. A top surface and two lateral surfaces of a central region of the first fin are covered by the first gate dielectric layer. A top surface and two lateral surfaces of a central region of the second fin are covered by the second gate dielectric layer. The first gate dielectric layer and the second gate dielectric layer are covered by the first gate layer. A first terminal of the third fin is electrically connected with a second terminal of the first fin. A second terminal of the third fin is not electrically connected with the second drain/source contact layer. A first terminal of the fourth fin is electrically connected with a second terminal of the second fin. A second terminal of the fourth fin is electrically connected with the second drain/source contact layer. The second gate structure includes a third gate dielectric layer, a fourth gate dielectric layer and a second gate layer. A top surface and two lateral surfaces of a central region of the third fin are covered by the third gate dielectric layer. A top surface and two lateral surfaces of a central region of the fourth fin are covered by the fourth gate dielectric layer. The third gate dielectric layer and the fourth gate dielectric layer are covered by the second gate layer. The second gate layer is electrically connected with an antifuse control line. A first terminal of the fifth fin is electrically connected with the second drain/source contact layer. A second terminal of the fifth fin is electrically connected with the third drain/source contact layer. The third gate structure includes a fifth gate dielectric layer and a third gate layer. A top surface and two lateral surfaces of a central region of the fifth fin are covered by the fifth gate dielectric layer. The fifth gate dielectric layer is covered by the third gate layer.

Another embodiment of the present invention provides a one time programming (OTP) memory cell using a physically unclonable function technology. The OTP memory cell includes a first transistor, a first fin, a first gate structure, a second fin, a second gate structure and a second transistor. The first transistor includes a first drain/source terminal, a gate terminal and a second drain/source terminal. A first terminal of the first fin is electrically connected with the second drain/source terminal of the first transistor. The first gate structure includes a first gate dielectric layer and a first gate layer. A top surface and two lateral surfaces of a central region of the first fin are covered by the first gate dielectric layer. The first gate dielectric layer is covered by the first gate layer. The first gate layer is connected with a first antifuse control line. A first terminal of the second fin is electrically connected with a second terminal of the first fin. The second gate structure includes a second gate dielectric layer and a second gate layer. A top surface and two lateral surfaces of a central region of the second fin are covered by the second gate dielectric layer. The second gate dielectric layer is covered by the second gate layer. The second gate layer is connected with a second antifuse control line. The second transistor includes a first drain/source terminal, a gate terminal and a second drain/source terminal. The first drain/source terminal of the second transistor is connected with a second terminal of the second fin.

Another embodiment of the present invention provides a one time programming (OTP) memory cell using a physically unclonable function technology. The OTP memory cell includes a first drain/source contact layer, a second drain/source contact layer, a first fin, a second fin, a first gate structure, a third fin, a fourth fin, a second gate structure, a fifth fin, a sixth fin and a third gate structure. The first drain/source contact layer is connected with a first bit line. The second drain/source contact layer is connected with a second bit line. A first terminal of the first fin is electrically connected with the first drain/source contact layer. A first terminal of the second fin is electrically connected with the second drain/source contact layer. The first gate structure includes a first gate dielectric layer, a second gate dielectric layer and a first gate layer. A top surface and two lateral surfaces of a central region of the first fin are covered by the first gate dielectric layer. A top surface and two lateral surfaces of a central region of the second fin are covered by the second gate dielectric layer. The first gate dielectric layer and the second gate dielectric layer are covered by the first gate layer. The first gate layer is connected with a word line. A first terminal of the third fin is electrically connected with a second terminal of the first fin. A first terminal of the fourth fin is electrically connected with a second terminal of the second fin. The second gate structure includes a third gate dielectric layer, a fourth gate dielectric layer and a second gate layer. A top surface and two lateral surfaces of a central region of the third fin are covered by the third gate dielectric layer. A top surface and two lateral surfaces of a central region of the fourth fin are covered by the fourth gate dielectric layer. The third gate dielectric layer and the fourth gate dielectric layer are covered by the second gate layer. The second gate layer is connected with a following control line. A first terminal of the fifth fin is electrically connected with a second terminal of the third fin. A first terminal of the sixth fin is electrically connected with a second terminal of the fourth fin. The third gate structure includes a fifth gate dielectric layer, a sixth gate dielectric layer and a third gate layer. A top surface and two lateral surfaces of a central region of the fifth fin are covered by the fifth gate dielectric layer. A top surface and two lateral surfaces of a central region of the sixth fin are covered by the sixth gate dielectric layer. The fifth gate dielectric layer and the sixth gate dielectric layer are covered by the third gate layer. The third gate layer is connected with an antifuse control line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3C and FIG. 3D schematically illustrate associated bias voltages for performing a read action on the OTP memory cell according to the first embodiment of the present invention;

FIG. 10 is a schematic top view illustrating the structure of an OTP memory cell using a PUF technology according to a seventh embodiment of the present invention;

DETAILED DESCRIPTION OF PREFERRED EMBODIMENTS

As used herein, the term "ruptured" may be referred to as "quantum-tunneling" technique. In detail, after energy accumulated on the gate terminals of a FinFET transistors reaches a certain level, quantum-tunneling may occur on the FinFET transistor. The energy accumulated on the gate terminals of the FinFET transistor will be released via a gate leakage path of which undergoing quantum-tunneling. Thus, FinFET transistors would generate a quantum-tunneling current higher than a predetermined threshold value. The mechanism of quantum-tunneling mentioned above may be similar to a gate oxide breakdown, but is not limited to a hard/destructive breakdown. For example, the quantum-tunneling may be a soft breakdown that leverages trap-assisted tunneling, but the present invention is not limited thereto. For better comprehension, the FinFET transistor which generates a quantum-tunneling current higher than the predetermined threshold value may be referred to as being "ruptured", and the FinFET transistor which generates a quantum-tunneling current lower than the predetermined threshold value (or does not undergo the quantum-tunneling) may be referred to as being "unruptured".

Figure 1A:
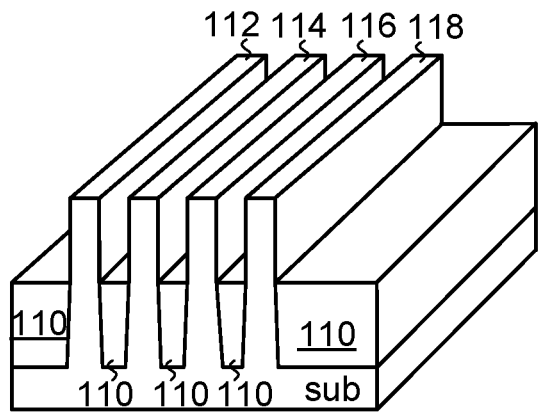
FIG. 1A, FIG. 1B and FIG. 10 are schematic perspective views illustrating a process of manufacturing a FinFET transistor according to an embodiment of the present invention.
Figure 1B:
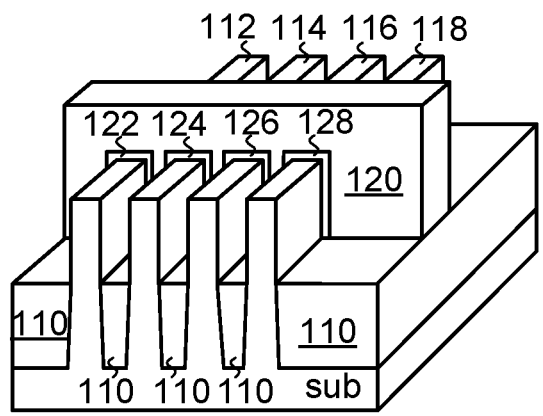
Figure 1C:
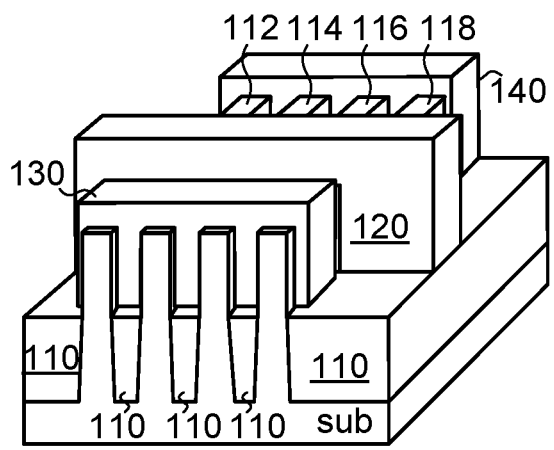
FIG. 1D is a schematic top view illustrating the FinFET transistor as shown in FIG. 10.
Figure 1D:
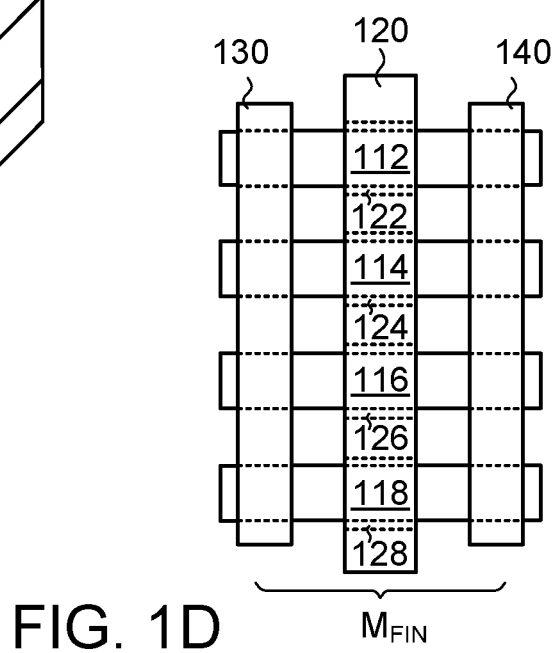

FIG. 1A, FIG. 1B and FIG. 1C are schematic perspective views illustrating a process of manufacturing a FinFET transistor according to an embodiment of the present invention. FIG. 1D is a schematic top view illustrating the FinFET transistor as shown in FIG. 1C.

Please refer to FIG. 1A. Firstly, an etching process is performed on a semiconductor substrate sub. Consequently, plural protrusion structures are formed. These protrusion structures are protruded from the surface of the semiconductor substrate sub. Then, an isolation layer 110 is formed to cover the surface of the semiconductor substrate sub and the lower portions of the protrusion structures. The upper portions of the protrusion structures uncovered by the isolation layer 110 are formed as fins 112, 114, 116 and 118. That is, these fins 112, 114, 116 and 118 are extended from the semiconductor substrate sub, and these fins 112, 114, 116 and 118 are protruded over the surface of the isolation layer 110.

Please refer to FIG. 1B. Then, a gate structure is formed over the isolation layer 110 to cover the central regions of the fins 112, 114, 116 and 118. Moreover, the two side regions of the fins 112, 114, 116 and 118 are exposed. The gate structure comprises plural gate dielectric layers 122, 124, 126 and 128 and a gate layer 120. The gate dielectric layers 122, 124, 126 and 128 cover the top surfaces and the lateral surfaces of the central regions of the fins 112, 114, 116 and 118, respectively. Moreover, the gate layer 120 covers the gate dielectric layers 122, 124, 126 and 128, and the gate layer 120 is formed over the isolation layer 110.

Please refer to FIG. 1C. Then, two drain/source contact layers 130 and 140 are formed. The drain/source contact layer 130 is contacted with the first side regions of the fins 112, 114, 116 and 118. The drain/source contact layer 130 is contacted with the second side regions of the fins 112, 114, 116 and 118.

Consequently, the two drain/source contact layers 130 and 140, the gate structure and the fins 112, 114, 116 and 118 are collaboratively formed as the FinFET transistor. In addition, the central regions of the fins 112, 114, 116 and 118 may be considered as a channel region of the FinFET transistor.

The fins 112, 114, 116 and 118 may have various dopant types. For example, in an embodiment, the first side regions and the second side regions of the fins 112, 114, 116 and 118 are N-doped regions, and the central regions of the fins 112, 114, 116 and 118 are undoped regions. In another embodiment, the first side regions and the second side regions of the fins 112, 114, 116 and 118 are P-doped regions, and the central regions of the fins 112, 114, 116 and 118 are undoped regions. Alternatively, the entire of each of the fins 112, 114, 116 and 118 is a P-doped region. Alternatively, the entire of each of the fins 112, 114, 116 and 118 is an N-doped region. Alternatively, the entire of each of the fins 112, 114, 116 and 118 is an undoped region.

For well understanding the concept of the present invention, the isolation layer 110 and the semiconductor substrate sub of the FinFET transistor $M_{FIN}$ are not shown in the top view of FIG. 1D. As shown in FIG. 1D, the FinFET transistor $M_{FIN}$ comprises the gate structure, the fins 112, 114, 116 and 118 and the drain/source contact layers 130 and 140. The gate structure comprises the gate dielectric layers 122, 124, 126 and 128 and the gate layer 120. The gate dielectric layers 122, 124, 126 and 128 cover the top surfaces and the lateral surfaces of the central regions of the fins 112, 114, 116 and 118, respectively. The gate layer 120 covers the gate dielectric layers 122, 124, 126 and 128. The drain/source contact layer 130 is contacted with the top surfaces of the first side regions of the fins 112, 114, 116 and 118. The drain/source contact layer 130 is contacted with the top surfaces of the second side regions of the fins 112, 114, 116 and 118.

As shown in FIG. 1D, the FinFET transistor $M_{FIN}$ comprises four fins 112, 114, 116 and 118. It is noted that the number of fins in the FinFET transistor $M_{FIN}$ is not restricted.

In accordance with the present invention, plural FinFET transistors are formed over the semiconductor substrate and collaboratively formed as an OTP memory cell, and the structures of some FinFET transistors are modified. Furthermore, the connecting relationships between these FinFET transistors are specially designed to complete the OTP memory cell of the present invention according to the concepts of the PUF technology.

Figure 2A:
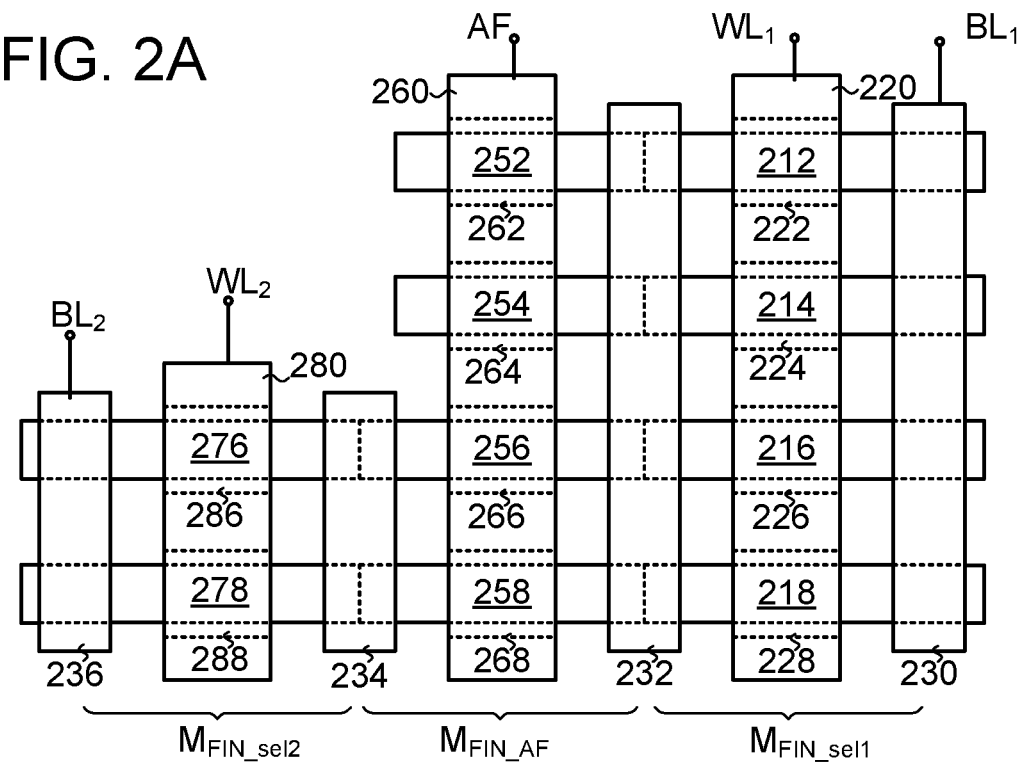
FIG. 2A is a schematic top view illustrating the structure of an OTP memory cell using a PUF technology according to a first embodiment of the present invention.

FIG. 2A is a schematic top view illustrating the structure of an OTP memory cell using a PUF technology according to a first embodiment of the present invention. In this embodiment, the OTP memory cell comprises three FinFET transistors. The structure of each of the three FinFET transistors is similar to that of FIG. 1D, and not redundantly described herein. As shown in FIG. 2A, the OTP memory cell comprises a first select transistor $M_{FIN\_sel1}$, a second select transistor $M_{FIN\_sel2}$ and an antifuse transistor $M_{FIN\_AF}$.

The first select transistor $M_{FIN\_sel1}$ comprises a drain/source contact layer 230, a drain/source contact layer 232, a gate structure and four fins 212, 214, 216 and 218. The gate structure covers the central regions of the fins 212, 214, 216 and 218. The gate structure comprises gate dielectric layers 222, 224, 226 and 228 and the gate layer 220. The gate dielectric layers 222, 224, 226 and 228 cover the top surfaces and the lateral surfaces of the central regions of the fins 212, 214, 216 and 218, respectively. The gate layer 220 covers the gate dielectric layers 222, 224, 226 and 228. The drain/source contact layer 230 is contacted with the top surfaces of the first side regions of the fins 212, 214, 216 and 218. The drain/source contact layer 232 is contacted with the top surfaces of the second side regions of the fins 212, 214, 216 and 218. In other words, the first terminals of the fins 212, 214, 216 and 218 are electrically connected with the drain/source contact layer 230, and the second terminals of the fins 212, 214, 216 and 218 are electrically connected with the drain/source contact layer 232.

The antifuse transistor $M_{FIN\_AF}$ comprises the drain/source contact layer 232, a drain/source contact layer 234, a gate structure and four fins 252, 254, 256 and 258. The gate structure covers the central regions of the fins 252, 254, 256 and 258. The gate structure comprises gate dielectric layers 262, 264, 266 and 268 and a gate layer 260. The gate dielectric layers 262, 264, 266 and 268 cover the top surfaces and the lateral surfaces of the central regions of the fins 252, 254, 256 and 258, respectively. The gate layer 260 covers the gate dielectric layers 262, 264, 266 and 268. The drain/source contact layer 232 is contacted with the top surfaces of the first side regions of the fins 252, 254, 256 and 258. In the first embodiment, the drain/source contact layer 234 is contacted with the top surfaces of the second side regions of the fins 256 and 258, but the drain/source contact layer 234 is not contacted with the top surfaces of the second side regions of the fins 252 and 254. In other words, the first terminals of the fins 252, 254, 256 and 258 are electrically connected with the drain/source contact layer 232, and the second terminals of the fins 256 and 258 are electrically connected with the drain/source contact layer 234. However, the second terminals of the fins 252 and 254 are not electrically connected with the drain/source contact layer 234.

As shown in FIG. 2A, the first terminal of the fin 252 of the antifuse transistor $M_{FIN\_AF}$ is electrically connected with the second terminal of the fin 212 of the first select transistor $M_{FIN\_sel1}$. Similarly, the first terminals of the fins 254, 256 and 258 of the antifuse transistor $M_{FIN\_AF}$ are electrically connected with the second terminals of the fins 214, 216 and 218 of the first select transistor $M_{FIN\_sel1}$, respectively.

It is noted that the structure of the OTP memory cell of the first embodiment may be modified. For example, in another embodiment, the fin 252 of the antifuse transistor $M_{FIN\_AF}$ and the fin 212 of the first select transistor $M_{FIN\_sel1}$ are integrated as a long fin on the semiconductor substrate. The long fin is divided into two parts. That is, the first part of the long fin is the fin 212 of the first select transistor $M_{FIN\_sel1}$, and the second part of the long fin is the fin 252 of the antifuse transistor $M_{FIN\_AF}$. Similarly, the fin 254 and the fin 214 are integrally formed. Similarly, the fin 256 and the fin 216 are integrally formed. Similarly, the fin 258 and the fin 218 are integrally formed.

The second select transistor $M_{FIN\_sel2}$ comprises the drain/source contact layer 234, a drain/source contact layer 236, a gate structure and two fins 276 and 278. The gate structure covers the central regions of the fins 276 and 278. The gate structure comprises gate dielectric layers 286 and 288 and a gate layer 280. The gate dielectric layers 286 and 288 cover the top surfaces and the lateral surfaces of the central regions of the fins 276 and 278, respectively. The gate layer 280 covers the gate dielectric layers 286 and 288. The drain/source contact layer 234 is contacted with the top surfaces of the first side regions of the fins 276 and 278. The drain/source contact layer 236 is contacted with the top surfaces of the second side regions of the fins 276 and 278. In other words, the first terminals of the fins 276 and 278 are electrically connected with the drain/source contact layer 234, and the second terminals of the fins 276 and 278 are electrically connected with the drain/source contact layer 236.

As shown in FIG. 2A, the second terminal of the fin 256 of the antifuse transistor $M_{FIN\_AF}$ is electrically connected with the first terminal of the fin 276 of the second select transistor $M_{FIN\_sel2}$. Similarly, the second terminal of the fin 258 of the antifuse transistor $M_{FIN\_AF}$ is electrically connected with the first terminal of the fin 278 of the second select transistor $M_{FIN\_sel1}$.

It is noted that the structure of the OTP memory cell of the first embodiment may be modified. In a variant example of the first embodiment, the fin 276 of the second select transistor $M_{FIN\_sel2}$, the fin 256 of the antifuse transistor $M_{FIN\_AF}$ and the fin 216 of the first select transistor $M_{FIN\_sel1}$ are integrally formed. Similarly, the fin 278 of the second select transistor $M_{FIN\_sel2}$, the fin 258 of the antifuse transistor $M_{FIN\_AF}$ and the fin 218 of the first select transistor $M_{FIN\_sel1}$ are integrally formed.

In the first select transistor $M_{FIN\_sel1}$, the drain/source contact layer 230 is connected with a first bit line $BL_1$, and the gate layer 220 is connected with a first word line $WL_1$. In the antifuse transistor $M_{FIN\_AF}$, the gate layer 260 is connected with an antifuse control line AF. In the second select transistor $M_{FIN\_sel2}$, the drain/source contact layer 236 is connected with a second bit line $BL_2$, and the gate layer 280 is connected with a second word line $WL_2$.

Figure 2B:
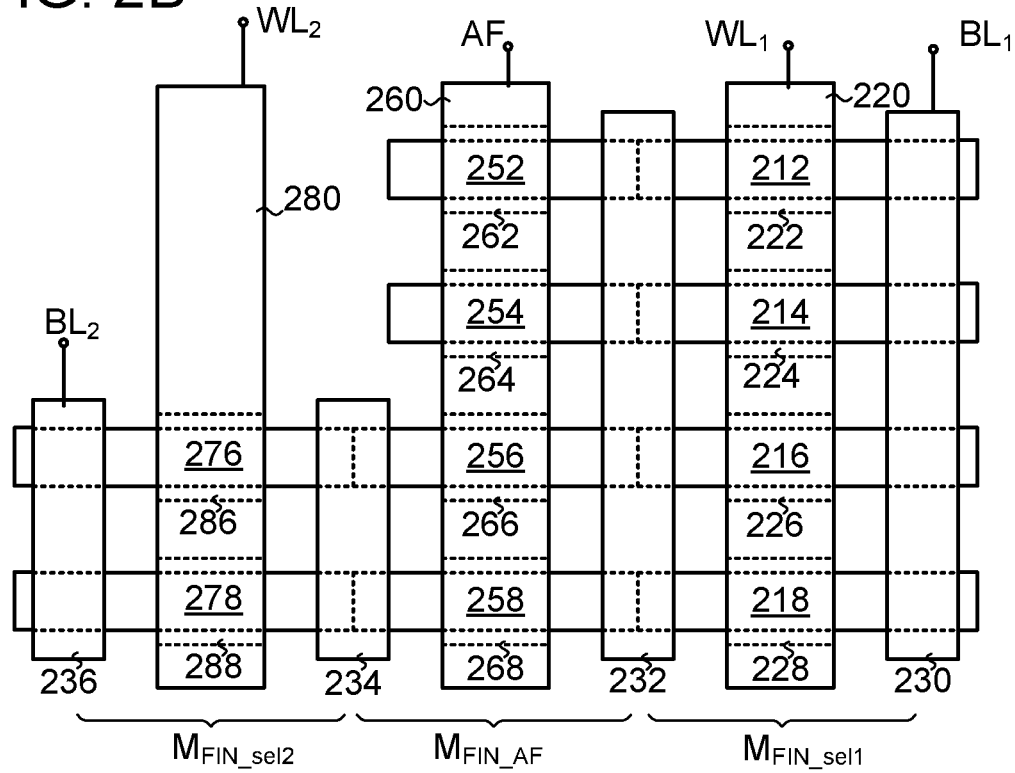
FIG. 2B is a schematic top view illustrating the structure of a variant example of the OTP memory cell of the first embodiment of the present invention.

As shown in FIG. 2A, the size of the gate structure of the second select transistor $M_{FIN\_sel2}$ is smaller when compared with the size of the gate structure of the first select transistor $M_{FIN\_sel1}$ and the size of the gate structure of the antifuse transistor $M_{FIN\_AF}$. It is noted that the structure of the OTP memory cell may be modified. FIG. 2B is a schematic top view illustrating the structure of a variant example of the OTP memory cell of the first embodiment of the present invention. As shown in FIG. 2B, the size of the gate structure of the first select transistor $M_{FIN\_sel1}$, the size of the gate structure of the second select transistor $M_{FIN\_sel2}$ and the size of the gate structure of the antifuse transistor $M_{FIN\_AF}$ are identical.

Figure 3A:
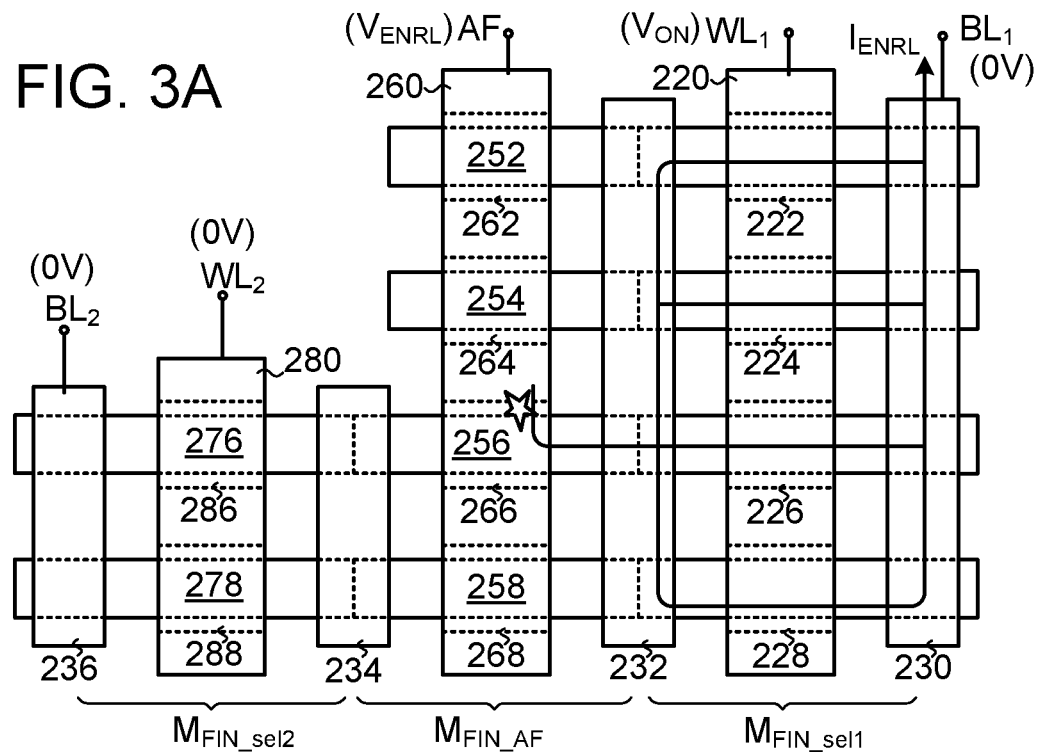
FIG. 3A and FIG. 3B schematically illustrate associated bias voltages for performing an enroll action on the OTP memory cell according to the first embodiment of the present invention.
Figure 3B:
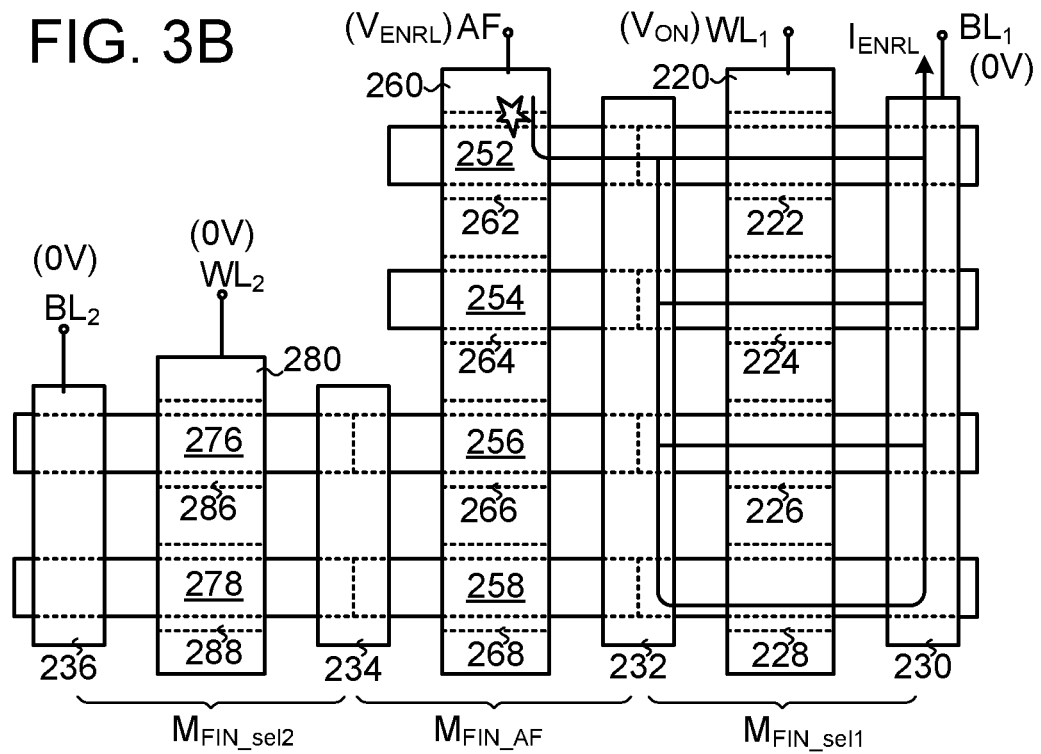

FIG. 3A and FIG. 3B schematically illustrate associated bias voltages for performing an enroll action on the OTP memory cell according to the first embodiment of the present invention. FIG. 3C and FIG. 3D schematically illustrate associated bias voltages for performing a read action on the OTP memory cell according to the first embodiment of the present invention.

In the OTP memory cell of the first embodiment, the region between the first bit line $BL_1$ and the antifuse control line AF is an enroll path. When the first select transistor $M_{FIN\_sel1}$ is turned on, the enroll path is turned on. When the first select transistor $M_{FIN\_sel1}$ is turned off, the enroll path is turned off. Similarly, the region between the second bit line $BL_2$ and the antifuse control line AF is a read path. When the second select transistor $M_{FIN\_sel2}$ is turned on, the read path is turned on. When the second select transistor $M_{FIN\_sel2}$ is turned off, the read path is turned off.

Please refer to FIG. 3A and FIG. 3B. When the enroll action is performed, the first bit line $BL_1$ receives a ground voltage (0V), the first word line $WL_1$ receives an on voltage $V_{ON}$, the antifuse control line AF receives an enroll voltage $V_{ENRL}$, the second word line $WL_2$ receives the ground voltage (0V), and the second bit line $BL_2$ receives the ground voltage (0V). For example, the enroll voltage $V_{ENRL}$ is in the range between 3V and 6V, and the on voltage $V_{ON}$ is in the range between 0.4V and 3V. Under this circumstance, the first select transistor $M_{FIN\_sel1}$ is turned on, and the second select transistor $M_{FIN\_sel2}$ is turned off. That is, the enroll path is turned on, and the read path is turned off.

In the enroll path, the first select transistor $M_{FIN\_sel1}$ is turned on. Consequently, the ground voltage (0V) of the first bit line $BL_1$ is transmitted to the drain/source contact layer 232 and the fins 252, 254, 256 and 258 of the antifuse transistor $M_{FIN\_AF}$ through the first select transistor $M_{FIN\_sel1}$. Consequently, when the antifuse control line AF receives the enroll voltage $V_{ENRL}$, the voltage stress between the fins 252, 254, 256 and 258 and the gate layer 260 of the antifuse transistor $M_{FIN\_AF}$ is equal to the enroll voltage $V_{ENRL}$. Under this circumstance, one of the gate dielectric layers 262, 264, 266 and 268 of the antifuse transistor $M_{FIN\_AF}$ is ruptured.

Due to the process variation of the OTP memory cell, it is unable to predict which of the gate dielectric layers 262, 264, 266 and 268 of the antifuse transistor $M_{FIN\_AF}$ is ruptured when the enroll action is performed. Consequently, the PUF technology can be applied to the OTP memory cell of the first embodiment.

For example, in the OTP memory cell as shown in FIG. 3A, the gate dielectric layer 266 is ruptured when the enroll action is performed. Consequently, an enroll current $I_{ENRL}$ is generated. The enroll current $I_{ENRL}$ flows from the antifuse control line AF to the first bit line $BL_1$ through the gate layer 260, the gate dielectric layer 266, the fin 256, the drain/source contact layer 232 and the first select transistor $M_{FIN\_sel1}$. Since the gate dielectric layer 266 is ruptured, the region between the gate layer 260 and the fin 256 has a low resistance value.

Alternatively, in the OTP memory cell as shown in FIG. 3B, the gate dielectric layer 262 is ruptured when the enroll action is performed. Consequently, an enroll current $I_{ENRL}$ is generated. The enroll current $I_{ENRL}$ flows from the antifuse control line AF to the first bit line $BL_1$ through the gate layer 260, the gate dielectric layer 262, the fin 252, the drain/source contact layer 232 and the first select transistor $M_{FIN\_sel1}$. Since the gate dielectric layer 262 is ruptured, the region between the gate layer 260 and the fin 252 has a low resistance value.

In FIG. 3A, the gate dielectric layer 266 is ruptured when the enroll action is performed. In FIG. 3B, the gate dielectric layer 262 is ruptured when the enroll action is performed. In some other embodiments, the gate dielectric layer 264 or the gate dielectric layer 268 is ruptured when the enroll action is performed.

In the OTP memory cell of the first embodiment, only the fins 256 and 258 of the antifuse transistor $M_{FIN\_AF}$ are connected with the drain/source contact layer 234. However, the fins 252 and 254 of the antifuse transistor $M_{FIN\_AF}$ are not connected with the drain/source contact layer 234. Since the fins 252 and 254 of the antifuse transistor $M_{FIN\_AF}$ are not connected between the second bit line $BL_2$ and the antifuse control line AF, the fins 252 and 254 are not included in the read path. That is, only the fins 256 and 258 of the antifuse transistor $M_{FIN\_AF}$ are included in the read path.

Please refer to FIGS. 3C and 3D. When the read action is performed, the first bit line $BL_1$ receives the ground voltage (0V), the first word line $WL_1$ receives the ground voltage (0V), the antifuse control line AF receives a read voltage $V_{RD}$, the second word line $WL_2$ receives the on voltage $V_{ON}$, and the second bit line $BL_2$ receives the ground voltage (0V). For example, the read voltage $V_{RD}$ is in the range between 0.75V and 1.2V. Under this circumstance, the second select transistor $M_{FIN\_sel2}$ is turned on, and the first select transistor $M_{FIN\_sel1}$ is turned off. That is, the read path is turned on, and the enroll path is turned off.

As shown in FIG. 3C, the gate dielectric layer 266 of the antifuse transistor $M_{FIN\_AF}$ is ruptured, and the region between the fin 256 and the gate layer 260 has a low resistance value. Under this circumstance, the read path of the OTP memory cell generates a higher read current $I_{RD}$. The read current $I_{RD}$ flows from the antifuse control line AF to the second bit line $BL_2$ through the gate layer 260, the gate dielectric layer 266, the fin 256, the drain/source contact layer 234 and the second select transistor $M_{FIN\_sel2}$. Since the other gate dielectric layers 262, 264 and 268 of the antifuse transistor $M_{FIN\_AF}$ are not ruptured, the read current $I_{RD}$ does not flow through the corresponding fins 252, 254 and 258.

Similarly, if the gate dielectric layer 268 of the antifuse transistor $M_{FIN\_AF}$ is ruptured, the read path (i.e., the second bit line $BL_2$) generates a higher read current $I_{RD}$ when the read action is performed. The operating principles are similar to those mentioned above, and not redundantly described herein.

As shown in FIG. 3D, the gate dielectric layer 262 of the antifuse transistor $M_{FIN\_AF}$ is ruptured, and the region between the fin 252 and the gate layer 260 has a low resistance value. However, the fin 252 is not electrically connected with the drain/source contact layer 234. That is, the fin 252 is not connected with the second select transistor $M_{FIN\_sel2}$. Under this circumstance, no read current is generated by the OTP memory cell. That is, the magnitude of the current flowing through the read path between the antifuse control line AF and the second bit line $BL_2$ is nearly zero.

Similarly, if the gate dielectric layer 264 of the antifuse transistor $M_{FIN\_AF}$ is ruptured, the read current $I_{RD}$ on the read path (i.e., the second bit line $BL_2$) is nearly zero when the read action is performed. The operating principles are similar to those mentioned above, and not redundantly described herein.

As mentioned above, the read action is performed after the enroll action is completed. When the read action is performed, one bit of a random code can be determined according to the magnitude of the read current $I_{RD}$ in the second bit line $BL_2$. For example, a current comparator is provided. The current comparator receives the read current $I_{RD}$ and a reference current Iref. If the magnitude of the read current $I_{RD}$ is higher than the magnitude of the reference current Iref, a first logic value (e.g., "0") is determined as the random code. Whereas, if the magnitude of the read current $I_{RD}$ is lower than the magnitude of the reference current Iref, a second logic value (e.g., "1") is determined as the random code.

As mentioned above, the present invention provides the OTP memory cell using the PUF technology. In the OTP memory cell, the antifuse transistor $M_{FIN\_AF}$ is a FinFET transistor. For example, the antifuse transistor $M_{FIN\_AF}$ of the OTP memory cell as shown in FIG. 2 comprises the four fins 252, 254, 256 and 258. These fins are divided into two groups. The first terminals of the fins 256 and 258 in the first group are electrically connected with the drain/source contact layer 232. The second terminals of the fins 256 and 258 in the first group are electrically connected with the drain/source contact layer 234. The first terminals of the fins 252 and 254 in the second group are electrically contacted with the drain/source contact layer 232. The second terminals of the fins 252 and 254 in the second group are not electrically connected with the drain/source contact layer 234. If one of the gate dielectric layers 266 and 268 covering the fins 256 and 258 in the first group is ruptured after the enroll action is completed, the implementation of the read action can confirm that the one-bit random code has the first logic value (e.g., "0") according to the magnitude of the read current $I_{RD}$. Whereas, if one of the gate dielectric layers 262 and 264 covering the fins 252 and 254 in the second group is ruptured after the enroll action is completed, the implementation of the read action can confirm that the one-bit random code has the second logic value (e.g., "1") according to the magnitude of the read current $I_{RD}$.

In the OTP memory cell of the first embodiment, each of the first select transistor $M_{FIN\_sel1}$ IN and the antifuse transistor MF AF has four fins, and each of the second select transistor $M_{FIN\_sel2}$ has two fins. It is noted that numerous modifications and alterations may be made while retaining the teachings of the invention. For example, in some other embodiments, the first select transistor $M_{FIN\_sel1}$ has X fins, the second select transistor $M_{FIN\_sel2}$ has Y fins, and the antifuse transistor $M_{FIN\_AF}$ has Z fins. Moreover, the Z fins of the antifuse transistor $M_{FIN\_AF}$ are divided into a first group and a second group. The first select transistor $M_{FIN\_sel1}$ is electrically connected with the first group of fins and the second group of fins in the antifuse transistor $M_{FIN\_AF}$. The second select transistor $M_{FIN\_sel2}$ is electrically connected with the first group of fins in the antifuse transistor $M_{FIN\_AF}$ only.

For example, in a variant example of the OTP memory cell of the first embodiment, the first select transistor $M_{FIN\_sel1}$ has 1 fin (X=1), the second select transistor $M_{FIN\_sel2}$ has 1 fin (Y=1), and the antifuse transistor $M_{FIN\_AF}$ has two fins (Z=2). Due to this structural design, the OTP memory cell using the PUF technology has the smallest size.

Figure 4:
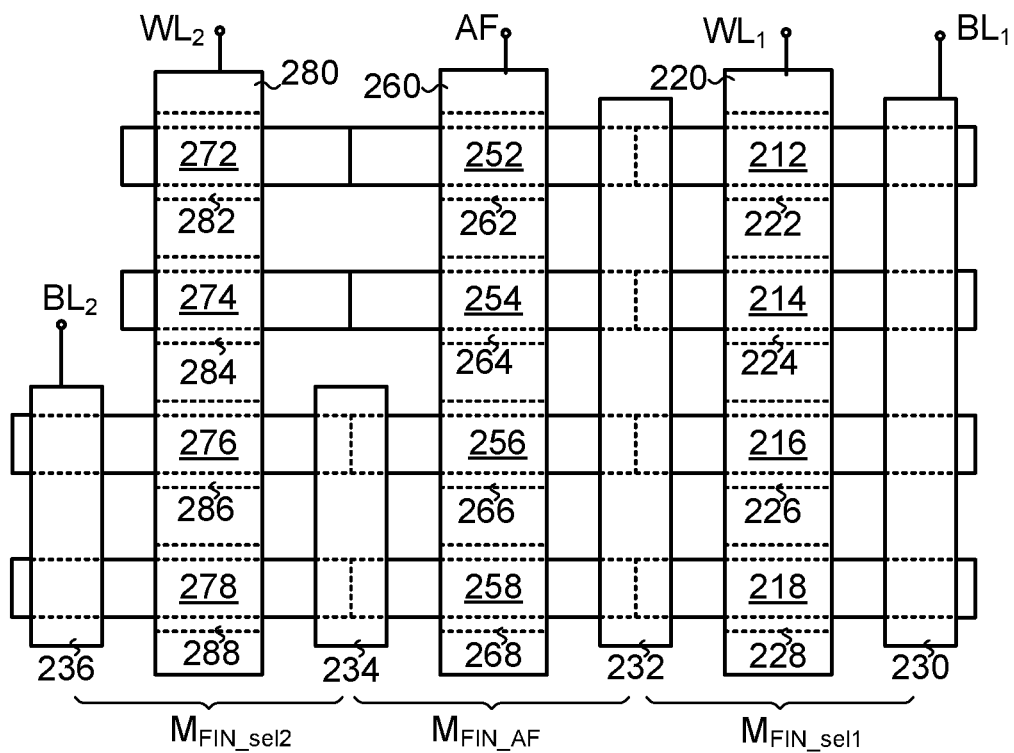
FIG. 4 is a schematic top view illustrating the structure of an OTP memory cell using a PUF technology according to a second embodiment of the present invention.

FIG. 4 is a schematic top view illustrating the structure of an OTP memory cell using a PUF technology according to a second embodiment of the present invention. In comparison with the OTP memory cell of the first embodiment as shown in FIG. 2A, the second select transistor $M_{FIN\_sel2}$ in the OTP memory cell of this embodiment further comprises two additional fins 272 and 274 and two corresponding gate dielectric layers 282 and 284. For succinctness, only the two additional fins 272 and 274 and the gate dielectric layers 282 and 284 of the second select transistor $M_{FIN\_sel2}$ will be described as follows.

As shown in FIG. 4, the gate structure of the second select transistor $M_{FIN\_sel2}$ further comprises the gate dielectric layers 282 and 284. The gate dielectric layers 282 and 284 cover the top surfaces and the lateral surfaces of the central regions of the fins 272 and 274, respectively. The gate layer 280 also covers the gate dielectric layers 282 and 284. Moreover, the second terminal of the fin 252 of the antifuse transistor $M_{FIN\_AF}$ is electrically connected with the first terminal of the fin 272 of the second select transistor $M_{FIN\_sel2}$. Similarly, the second terminal of the fin 254 of the antifuse transistor $M_{FIN\_AF}$ is electrically connected with the first terminal of the fin 274 of the second select transistor $M_{FIN\_sel2}$. However, the drain/source contact layer 234 is not contacted with the top surfaces of the first side regions of the fins 272 and 274.

Figure 5:
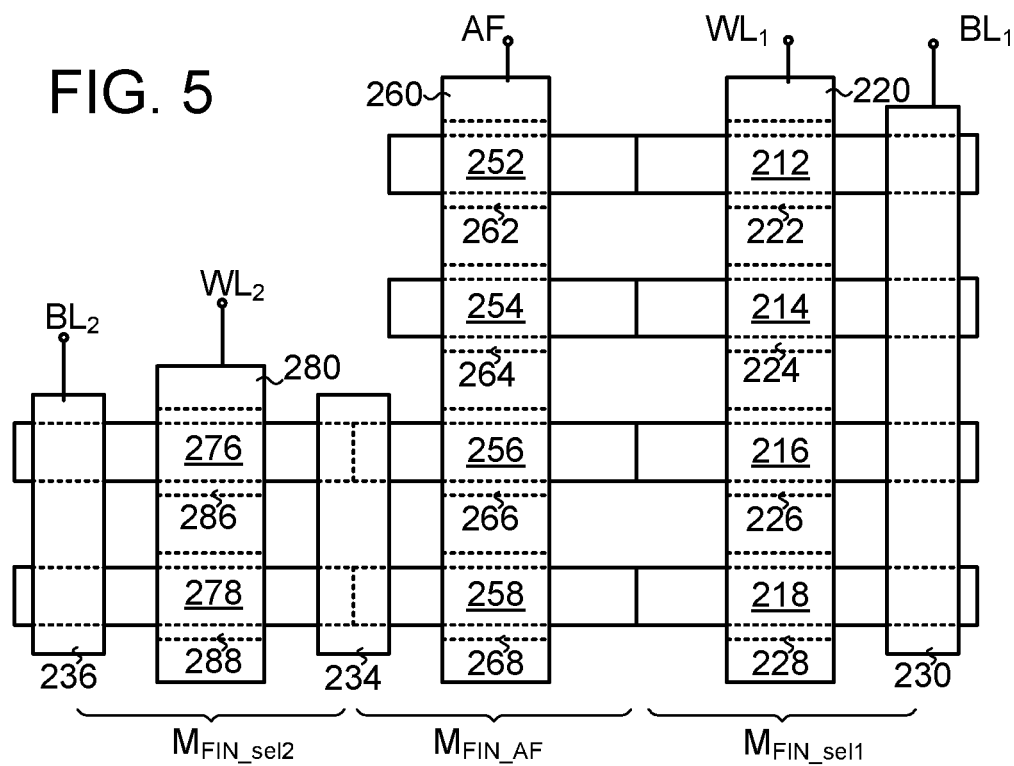
FIG. 5 is a schematic top view illustrating the structure of an OTP memory cell using a PUF technology according to a third embodiment of the present invention.

FIG. 5 is a schematic top view illustrating the structure of an OTP memory cell using a PUF technology according to a third embodiment of the present invention. In comparison with the OTP memory cell of the first embodiment as shown in FIG. 2A, the OTP memory cell of this embodiment is not equipped with the drain/source contact layer 232. The other structures of the OTP memory cell of this embodiment are similar to those of OTP memory cell of the first embodiment, and not redundantly described herein.

As shown in FIG. 5, the second terminal of the fin 212 of the first select transistor $M_{FIN\_sel1}$ is electrically connected with the first terminal of the fin 252 of the antifuse transistor $M_{FIN\_AF}$. Similarly, the second terminal of the fin 214 of the first select transistor $M_{FIN\_sel1}$ is electrically connected with the first terminal of the fin 254 of the antifuse transistor $M_{FIN\_AF}$. Similarly, the second terminal of the fin 216 of the first select transistor $M_{FIN\_sel1}$ is electrically connected with the first terminal of the fin 256 of the antifuse transistor $M_{FIN\_AF}$. Similarly, the second terminal of the fin 218 of the first select transistor $M_{FIN\_sel1}$ is electrically connected with the first terminal of the fin 258 of the antifuse transistor $M_{FIN\_AF}$.

In the OTP memory cell of the third embodiment as shown in FIG. 5, the first terminals of the fins 252, 254, 256 and 258 of the antifuse transistor $M_{FIN\_AF}$ are not electrically connected with each other. Consequently, when the read action is performed, the OTP memory cell is capable of preventing the fins 252 and 254 not on the read path from generating a leakage current to the second bit line $BL_2$. In other words, the misjudgment of the read result will be avoided.

The methods of performing the enroll action and the read action on the OTP memory cell of FIG. 4 and the OTP memory cell of FIG. 5 are similar to those of FIG. 2A. When the enroll action is performed on the OTP memory cell of FIG. 4 or FIG. 5, the bias voltages described in FIG. 3A and FIG. 3B are provided to the OTP memory cell. Moreover, when the read action is performed on the OTP memory cell of FIG. 4 or FIG. 5, the bias voltages described in FIG. 3C and FIG. 3D are provided to the OTP memory cell.

In the first, second and third embodiments, the OTP memory cell is composed of three FinFET transistors. In a variant example of the OTP memory cell of the first embodiment, the second embodiment or the third embodiment, only the antifuse transistor is implemented with the FinFET transistor, but the select transistors are implemented with other appropriate transistors such as planar field-effect transistors (also referred as planar FET transistors). For example, in another embodiment, the antifuse transistor $M_{FIN\_AF}$ with the structure of the FinFET transistor and two select transistors with the structures of the planar field-effect transistors are collaboratively formed as the OTP memory cell of the present invention.

Take the OTP memory cell as shown in FIG. 2A for example. The first drain/source terminal of the first select transistor is connected with the first bit line $BL_1$. The gate terminal of the first select transistor is connected with the first word line $WL_1$. The second drain/source terminal of the first select transistor is connected with the drain/source contact layer 232 of the antifuse transistor $M_{FIN\_AF}$. The first drain/source terminal of the second select transistor is connected with the drain/source contact layer 234 of the antifuse transistor $M_{FIN\_AF}$. The gate terminal of the first select transistor is connected with the second word line $WL_2$. The second drain/source terminal of the second select transistor is connected with the second bit line $BL_2$.

Figure 6A:
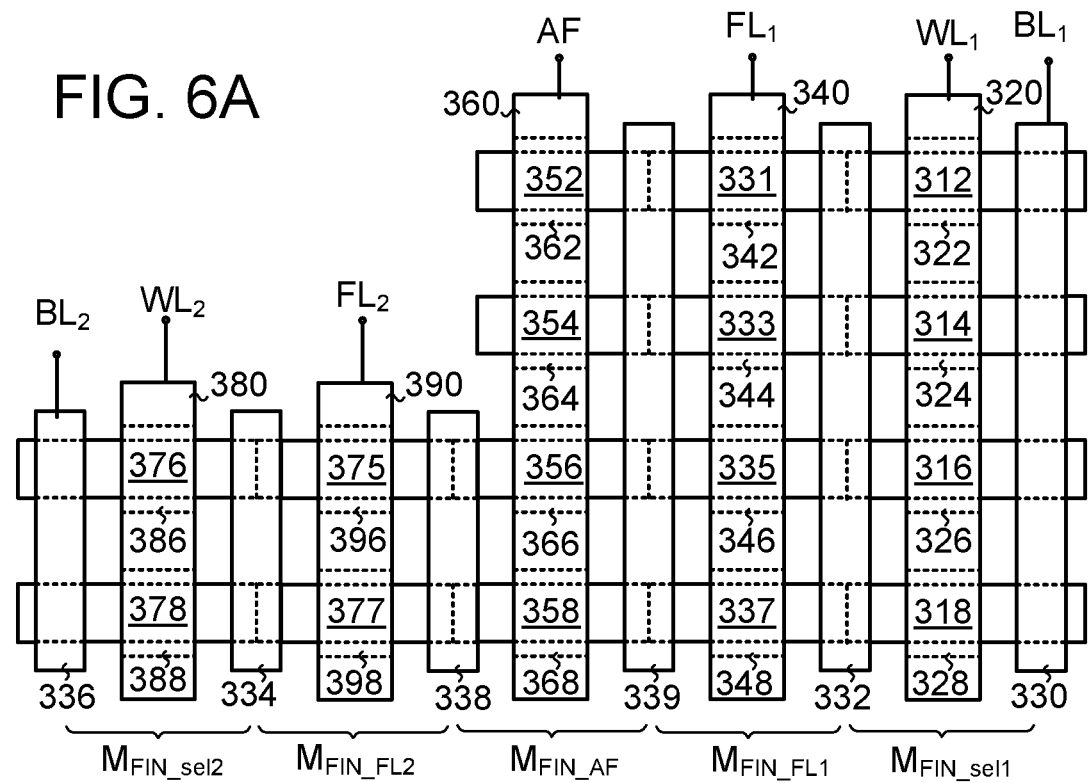
FIG. 6A is a schematic top view illustrating the structure of an OTP memory cell using a PUF technology according to a fourth embodiment of the present invention.

FIG. 6A is a schematic top view illustrating the structure of an OTP memory cell using a PUF technology according to a fourth embodiment of the present invention. In the fourth embodiment, the OTP memory cell comprises five FinFET transistors. The structure of each of the three FinFET transistors is similar to that of FIG. 1D, and not redundantly described herein. The OTP memory cell comprises a first select transistor $M_{FIN\_sel1}$, a second select transistor $M_{FIN\_sel2}$, a first following transistor $M_{FIN\_FL1}$, a second following transistor $M_{FIN\_FL2}$ and an antifuse transistor $M_{FIN\_AF}$.

The first select transistor $M_{FIN\_sel1}$ comprises a drain/source contact layer 330, a drain/source contact layer 332, a gate structure and four fins 312, 314, 316 and 318. The gate structure covers the central regions of the fins 312, 314, 316 and 318. The gate structure comprises gate dielectric layers 322, 324, 326 and 328 and a gate layer 320. The gate dielectric layers 322, 324, 326 and 328 cover the top surfaces and the lateral surfaces of the central regions of the fins 312, 314, 316 and 318, respectively. The gate layer 320 covers the gate dielectric layers 322, 324, 326 and 328. The drain/source contact layer 330 is contacted with the top surfaces of the first side regions of the fins 312, 314, 316 and 318. The drain/source contact layer 332 is contacted with the top surfaces of the second side regions of the fins 312, 314, 316 and 318. In other words, the first terminals of the fins 312, 314, 316 and 318 are electrically connected with the drain/source contact layer 330, and the second terminals of the fins 312, 314, 316 and 318 are electrically connected with the drain/source contact layer 332.

The first following transistor $M_{FIN\_FL1}$ comprises the drain/source contact layer 332, a drain/source contact layer 339, a gate structure and four fins 331, 333, 335 and 337. The gate structure covers the central regions of the fins 331, 333, 335 and 337. The gate structure comprises gate dielectric layers 342, 344, 346 and 348 and a gate layer 340. The gate dielectric layers 342, 344, 346 and 348 cover the top surfaces and the lateral surfaces of the central regions of the fins 331, 333, 335 and 337, respectively. The gate layer 340 covers the gate dielectric layers 342, 344, 346 and 348. The drain/source contact layer 332 is contacted with the top surfaces of the first side regions of the fins 331, 333, 335 and 337. The drain/source contact layer 339 is contacted with the top surfaces of the second side regions of the fins 331, 333, 335 and 337. In other words, the first terminals of the fins 331, 333, 335 and 337 are electrically connected with the drain/source contact layer 332, and the second terminals of the fins 331, 333, 335 and 337 are electrically connected with the drain/source contact layer 339.

As shown in FIG. 6A, the first terminal of the fin 331 of the first following transistor $M_{FIN\_FL1}$ is electrically connected with the second terminal of the fin 312 of the first select transistor $M_{FIN\_sel1}$. Similarly, the first terminals of the fins 333, 335 and 337 of the first following transistor $M_{FIN\_FL1}$ are electrically connected with the second terminals of the fins 314, 316 and 318 of the first select transistor $M_{FIN\_sel1}$, respectively.

The antifuse transistor $M_{FIN\_AF}$ comprises the drain/source contact layer 339, a drain/source contact layer 338, a gate structure and four fins 352, 354, 356 and 358. The gate structure covers the central regions of the fins 352, 354, 356 and 358. The gate structure comprises gate dielectric layers 362, 364, 366 and 368 and a gate layer 360. The gate dielectric layers 362, 364, 366 and 368 cover the top surfaces and the lateral surfaces of the central regions of the fins 352, 354, 356 and 358, respectively. The gate layer 360 covers the gate dielectric layers 362, 364, 366 and 368. The drain/source contact layer 339 is contacted with the top surfaces of the first side regions of the fins 352, 354, 356 and 358. In the fourth embodiment, the drain/source contact layer 338 is contacted with the top surfaces of the second side regions of the fins 356 and 358, but the drain/source contact layer 338 is not contacted with the top surfaces of the second side regions of the fins 352 and 354. In other words, the first terminals of the fins 352, 354, 356 and 358 are electrically connected with the drain/source contact layer 339, and the second terminals of the fins 356 and 358 are electrically connected with the drain/source contact layer 338. However, the second terminals of the fins 352 and 354 are not electrically connected with the drain/source contact layer 338.

As shown in FIG. 6A, the first terminal of the fin 352 of the antifuse transistor $M_{FIN\_AF}$ is electrically connected with the second terminal of the fin 331 of the first select transistor $M_{FIN\_sel1}$. Similarly, the first terminals of the fin 354, 356 and 358 of the antifuse transistor $M_{FIN\_AF}$ is electrically connected with the second terminals of the fin 333, 335 and 337 of the first select transistor $M_{FIN\_sel1}$, respectively.

The second following transistor $M_{FIN\_FL2}$ comprises the drain/source contact layer 338, a drain/source contact layer 334, a gate structure and two fins 375 and 377. The gate structure covers the central regions of the fins 375 and 377. The gate structure comprises gate dielectric layers 396 and 398 and a gate layer 390. The gate dielectric layers 396 and 398 cover the top surfaces and the lateral surfaces of the central regions of the fins 375 and 377, respectively. The gate layer 390 covers the gate dielectric layers 396 and 398. The drain/source contact layer 338 is contacted with the top surfaces of the first side regions of the fins 375 and 377. The drain/source contact layer 334 is contacted with the top surfaces of the second side regions of the fins 375 and 377. In other words, the first terminals of the fins 375 and 377 are electrically connected with the drain/source contact layer 338, and the second terminals of the fins 375 and 377 are electrically connected with the drain/source contact layer 334.

As shown in FIG. 6A, the first terminal of the fin 375 of the second following transistor $M_{FIN\_FL2}$ is electrically connected with the second terminal of the fin 356 of the antifuse transistor $M_{FIN\_AF}$. Similarly, the first terminal of the fin 377 of the second following transistor $M_{FIN\_FL2}$ is electrically connected with the second terminal of the fin 358 of the antifuse transistor $M_{FIN\_AF}$.

The second select transistor $M_{FIN\_sel2}$ comprises the drain/source contact layer 334, a drain/source contact layer 336, a gate structure and two fins 376 and 378. The gate structure covers the central regions of the fins 376 and 378. The gate structure comprises gate dielectric layers 386 and 388 and a gate layer 380. The gate dielectric layers 386 and 388 cover the top surfaces and the lateral surfaces of the central regions of the fins 376 and 378, respectively. The gate layer 380 covers the gate dielectric layers 386 and 388. The drain/source contact layer 334 is contacted with the top surfaces of the first side regions of the fins 376 and 378. The drain/source contact layer 336 is contacted with the top surfaces of the second side regions of the fins 376 and 378. In other words, the first terminals of the fins 376 and 378 are electrically connected with the drain/source contact layer 334, and the second terminals of the fins 376 and 378 are electrically connected with the drain/source contact layer 336.

As shown in FIG. 6A, the second terminal of the fin 375 of the second following transistor $M_{FIN\_FL2}$ is electrically connected with the first terminal of the fin 376 of the second select transistor $M_{FIN\_sel2}$. Similarly, the second terminal of the fin 377 of the second following transistor $M_{FIN\_FL2}$ is electrically connected with the first terminal of the fin 378 of the second select transistor $M_{FIN\_sel2}$.

It is noted that the structure of the OTP memory cell of the fourth embodiment may be modified. In a variant example of the fourth embodiment, the fins 312, 331 and 352 are integrally formed. Similarly, the fins 314, 333 and 354 are integrally formed. Similarly, the fins 316, 335, 356, 375 and 376 are integrally formed. Similarly, the fins 318, 337, 358, 377 and 378 are integrally formed.

In the first select transistor $M_{FIN\_sel1}$, the drain/source contact layer 330 is connected with a first bit line $BL_1$, and the gate layer 320 is connected with a first word line $WL_1$. In the first following transistor $M_{FIN\_FL1}$, the gate layer 340 is connected with a first following control line $FL_1$. In the antifuse transistor $M_{FIN\_AF}$, the gate layer 360 is connected with an antifuse control line AF. In the second following transistor $M_{FIN\_FL2}$, the gate layer 390 is connected with a second following control line $FL_2$. In the second select transistor $M_{FIN\_sel2}$, the drain/source contact layer 336 is connected with a second bit line $BL_2$, and the gate layer 380 is connected with a second word line $WL_2$.

Figure 6B:
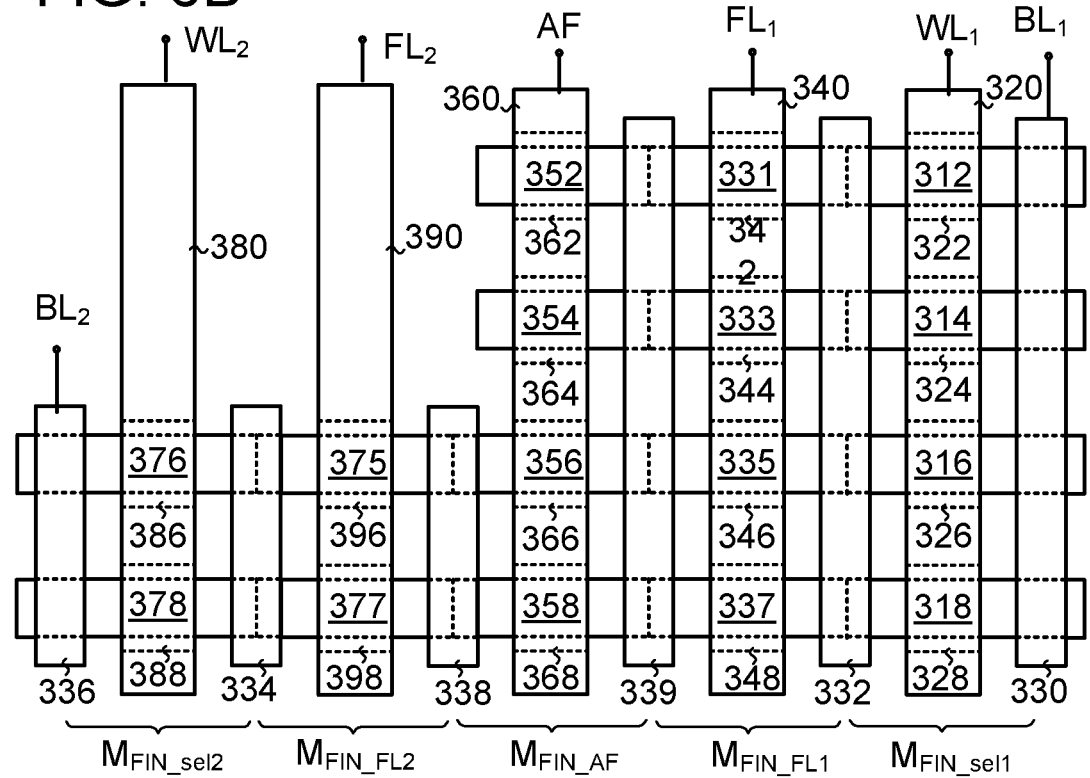
FIG. 6B is a schematic top view illustrating the structure of a variant example of the OTP memory cell of the fourth embodiment of the present invention.

As shown in FIG. 6A, the size of the gate structure of the second select transistor $M_{FIN\_sel2}$ and the size of the gate structure of the second following transistor $M_{FIN\_FL2}$ are smaller when compared with the size of the gate structure of the first select transistor $M_{FIN\_sel1}$, the size of the gate structure of the first following transistor $M_{FIN\_FL1}$ and the size of the gate structure of the antifuse transistor $M_{FIN\_AF}$. It is noted that the structure of the OTP memory cell may be modified. FIG. 6B is a schematic top view illustrating the structure of a variant example of the OTP memory cell of the fourth embodiment of the present invention. As shown in FIG. 6B, the size of the gate structure of the first select transistor $M_{FIN\_sel1}$, the size of the gate structure of the second select transistor $M_{FIN\_sel2}$, the size of the gate structure of the first following transistor $M_{FIN\_FL1}$, the size of the gate structure of the second following transistor $M_{FIN\_FL2}$ and the size of the gate structure of the antifuse transistor $M_{FIN\_AF}$ are identical.

Figure 7A:
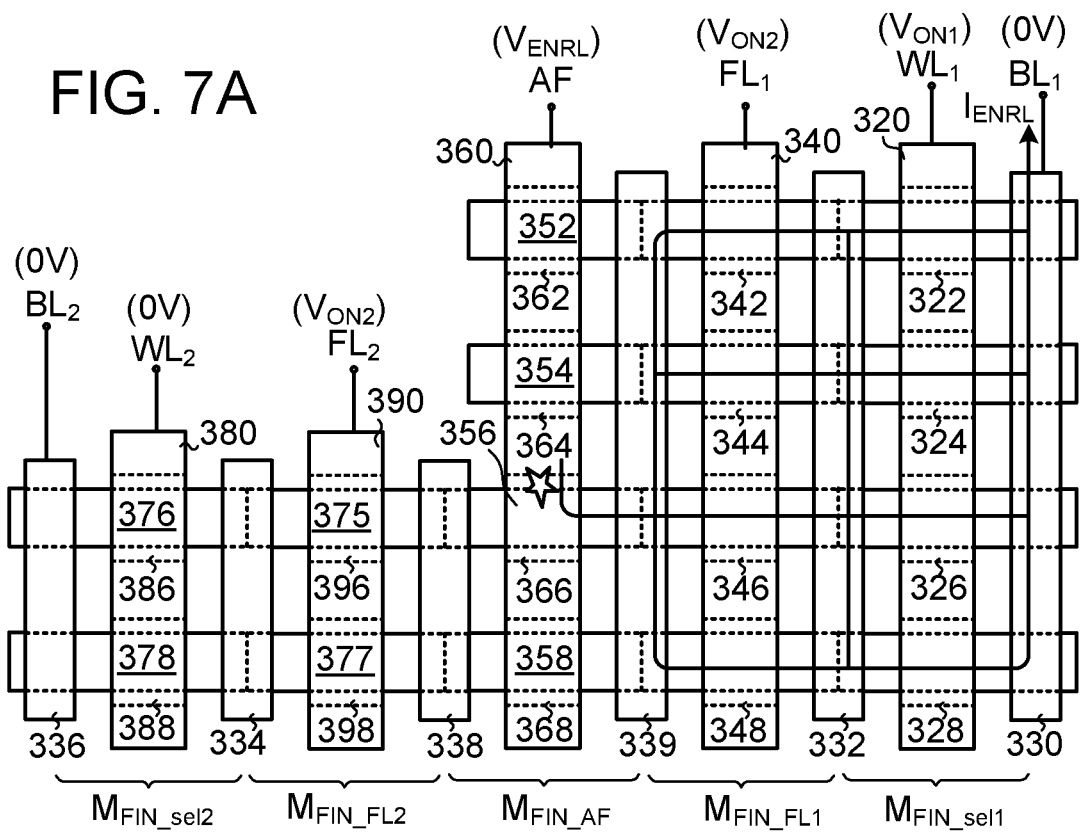
FIG. 7A and FIG. 7B schematically illustrate associated bias voltages for performing an enroll action on the OTP memory cell according to the fourth embodiment of the present invention.
Figure 7B:
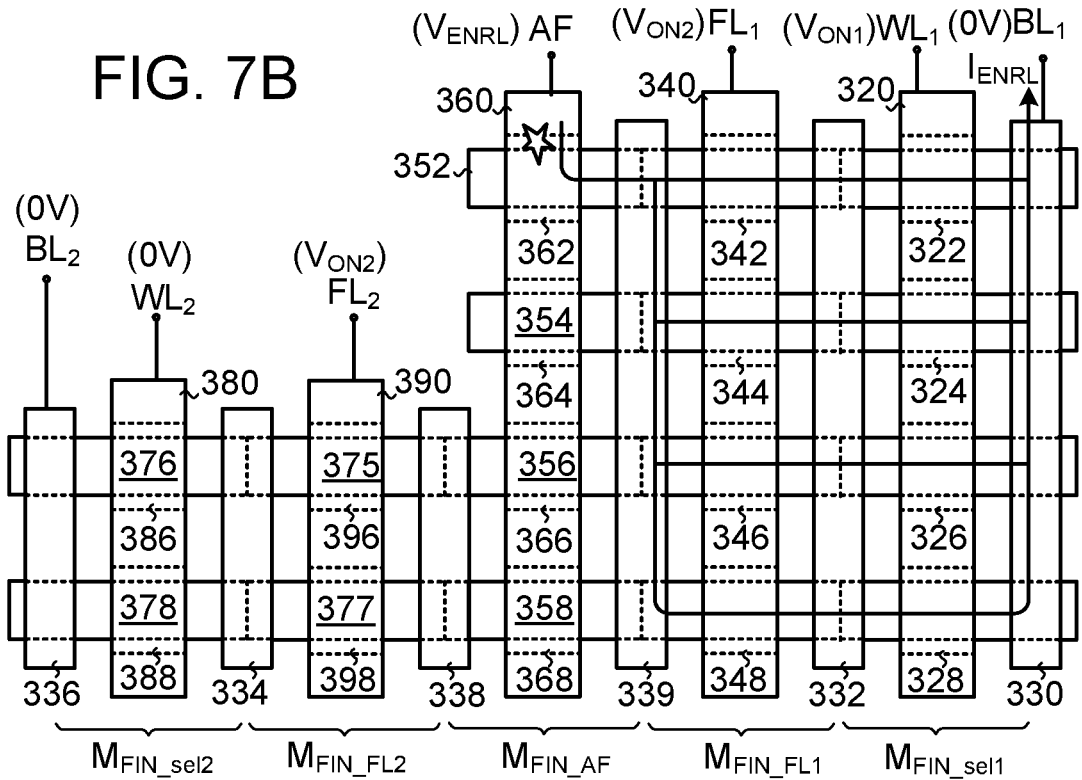
Figure 7C:
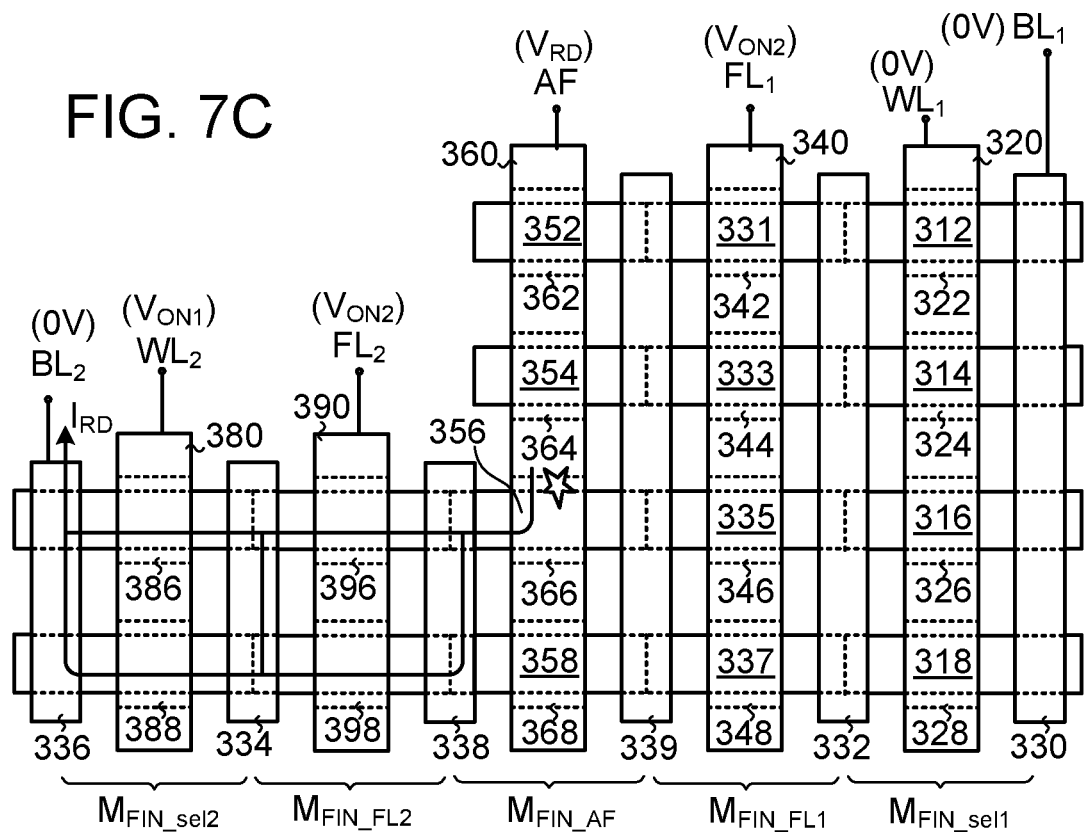
FIG. 7C and FIG. 7D schematically illustrate associated bias voltages for performing a read action on the OTP memory cell according to the fourth embodiment of the present invention.
Figure 7D:
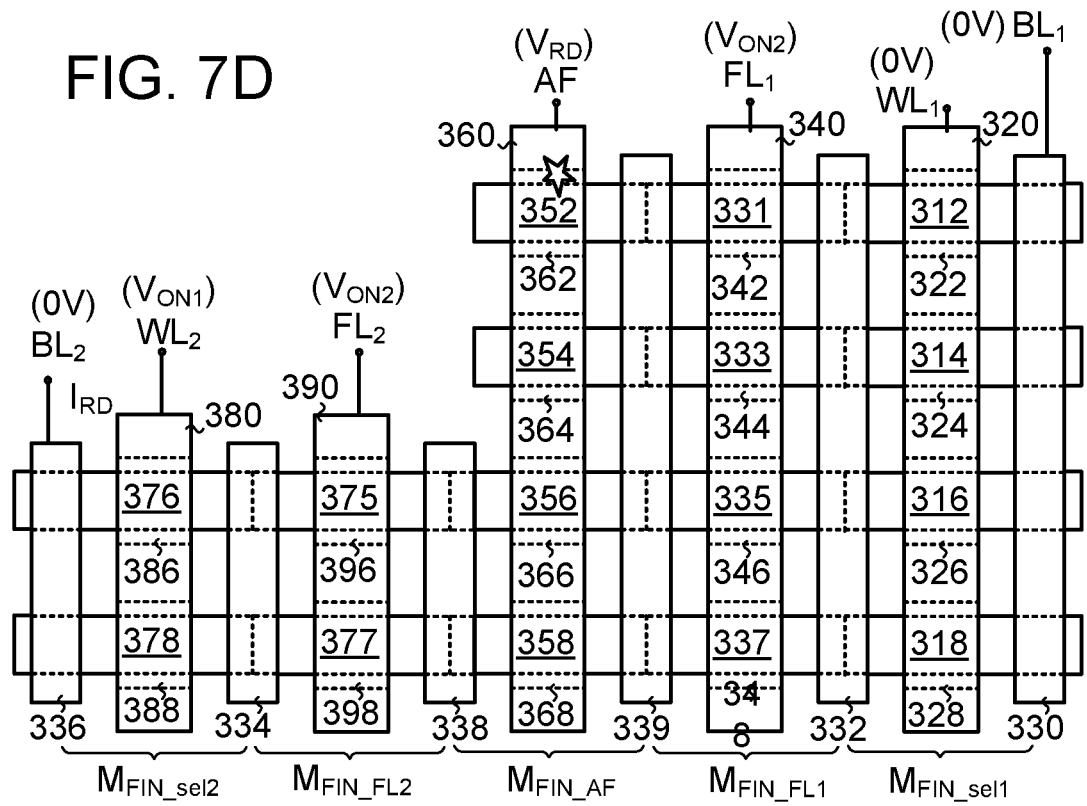

FIG. 7A and FIG. 7B schematically illustrate associated bias voltages for performing an enroll action on the OTP memory cell according to the fourth embodiment of the present invention. FIG. 7C and FIG. 7D schematically illustrate associated bias voltages for performing a read action on the OTP memory cell according to the fourth embodiment of the present invention.

In the OTP memory cell of the fourth embodiment, the region between the first bit line $BL_1$ and the antifuse control line AF is an enroll path. When the first select transistor $M_{FIN\_sel1}$ and the first following transistor $M_{FIN\_FL1}$ are turned on, the enroll path is turned on. When the first select transistor $M_{FIN\_sel1}$ and the first following transistor $M_{FIN\_FL1}$ are turned off, the enroll path is turned off. Similarly, the region between the second bit line $BL_2$ and the antifuse control line AF is a read path. When the second select transistor $M_{FIN\_sel2}$ and the second following transistor $M_{FIN\_FL2}$ are turned on, the read path is turned on. When the second select transistor $M_{FIN\_sel2}$ and the second following transistor $M_{FIN\_FL2}$ are turned off, the read path is turned off.

Please refer to FIG. 7A and FIG. 7B. When the enroll action is performed, the first bit line $BL_1$ receives a ground voltage (0V), the first word line $WL_1$ receives a first on voltage $V_{ON1}$, the first following control line $FL_1$ receives a second on voltage $V_{ON2}$, the antifuse control line AF receives an enroll voltage $V_{ENRL}$, the second word line $WL_2$ receives the ground voltage (0V), the second following control line $FL_2$ receives the second on voltage $V_{ON2}$, and the second bit line $BL_2$ receives the ground voltage (0V). For example, the enroll voltage $V_{ENRL}$ is in the range between 3V and 6V, the first on voltage $V_{ON1}$ is in the range between 0.4V and 3V, and the second on voltage $V_{ON2}$ is in the range between 0.4V and 3V. Under this circumstance, the first select transistor $M_{FIN\_sel1}$ and the first following transistor $M_{FIN\_FL1}$ are turned on, the second select transistor $M_{FIN\_sel2}$ is turned off, and the second following transistor $M_{FIN\_FL2}$ can be turned on or turned off. That is, the enroll path is turned on, and the read path is turned off.

In the enroll path, the first select transistor $M_{FIN\_sel1}$ and the first following transistor $M_{FIN\_FL1}$ are turned on. Consequently, the ground voltage (0V) of the first bit line $BL_1$ is transmitted to the drain/source contact layer 339 and the fins 352, 354, 356 and 358 of the antifuse transistor $M_{FIN\_AF}$ through the first select transistor $M_{FIN\_sel1}$ and the first following transistor $M_{FIN\_FL1}$. When the antifuse control line AF receives the enroll voltage $V_{ENRL}$, the voltage stress between the fins 352, 354, 356 and 358 and the gate layer 360 of the antifuse transistor $M_{FIN\_AF}$ is equal to the enroll voltage $V_{ENRL}$. Under this circumstance, one of the gate dielectric layers 362, 364, 366 and 368 of the antifuse transistor $M_{FIN\_AF}$ is ruptured. Due to the process variation of the OTP memory cell, it is unable to predict which of the gate dielectric layers 362, 364, 366 and 368 of the antifuse transistor $M_{FIN\_AF}$ is ruptured when the enroll action is performed. Consequently, the PUF technology can be applied to the OTP memory cell of the fourth embodiment.

For example, in the OTP memory cell as shown in FIG. 7A, the gate dielectric layer 366 is ruptured after the enroll action is completed. Consequently, an enroll current $I_{ENRL}$ is generated. The enroll current $I_{ENRL}$ flows from the antifuse control line AF to the first bit line $BL_1$ through the gate layer 360, the gate dielectric layer 366, the fin 356, the drain/source contact layer 339, the first following transistor $M_{FIN\_FL1}$, and the first select transistor $M_{FIN\_sel1}$. Since the gate dielectric layer 366 is ruptured, the region between the gate layer 360 and the fin 356 has a low resistance value.

Alternatively, in the OTP memory cell as shown in FIG. 7B, the gate dielectric layer 362 is ruptured when the enroll action is performed. Consequently, an enroll current $I_{ENRL}$ is generated. The enroll current $I_{ENRL}$ flows from the antifuse control line AF to the first bit line $BL_1$ through the gate layer 360, the gate dielectric layer 362, the fin 352, the drain/source contact layer 339, the first following transistor $M_{FIN\_FL1}$, and the first select transistor $M_{FIN\_sel1}$. Since the gate dielectric layer 362 is ruptured, the region between the gate layer 360 and the fin 352 has a low resistance value.

In FIG. 7A, the gate dielectric layer 366 is ruptured when the enroll action is performed. In FIG. 7B, the gate dielectric layer 362 is ruptured when the enroll action is performed. In some other embodiments, the gate dielectric layer 364 or the gate dielectric layer 368 is ruptured when the enroll action is performed.

In the OTP memory cell of the fourth embodiment, only the fins 356 and 358 of the antifuse transistor $M_{FIN\_AF}$ are connected with the drain/source contact layer 338. However, the fins 352 and 354 of the antifuse transistor $M_{FIN\_AF}$ are not connected with the drain/source contact layer 338. Since the fins 352 and 354 of the antifuse transistor $M_{FIN\_AF}$ are not connected between the second bit line $BL_2$ and the antifuse control line AF, the fins 352 and 354 are not included in the read path. That is, only the fins 356 and 358 of the antifuse transistor $M_{FIN\_AF}$ are included in the read path.

Please refer to FIGS. 7C and 7D. When the read action is performed, the first bit line $BL_1$ receives the ground voltage (0V), the first word line $WL_1$ receives the ground voltage (0V), the first following control line $FL_1$ receives the second on voltage $V_{ON2}$, the antifuse control line AF receives a read voltage $V_{RD}$, the second word line $WL_2$ receives the first on voltage $V_{ON1}$, the second following control line $FL_2$ receives the second on voltage $V_{ON2}$, and the second bit line $BL_2$ receives the ground voltage (0V). For example, the read voltage $V_{RD}$ is in the range between 0.75V and 1.2V. Under this circumstance, the second select transistor $M_{FIN\_sel2}$ and the second following transistor $M_{FIN\_FL2}$ are turned on, the first select transistor $M_{FIN\_sel1}$ is turned off, and the first following transistor $M_{FIN\_FL1}$ can be turned on or turned off. That is, the read path is turned on, and the enroll path is turned off.

As shown in FIG. 7C, the gate dielectric layer 366 of the antifuse transistor $M_{FIN\_AF}$ is ruptured, and the region between the fin 356 and the gate layer 360 has a low resistance value. Under this circumstance, the read path of the OTP memory cell generates a higher read current $I_{RD}$. The read current $I_{RD}$ flows from the antifuse control line AF to the second bit line $BL_2$ through the gate layer 360, the gate dielectric layer 366, the fin 356, the drain/source contact layer 338, the second following transistor $M_{FIN\_FL2}$ and the second select transistor $M_{FIN\_sel2}$. Since the other gate dielectric layers 362, 364 and 368 of the antifuse transistor $M_{FIN\_AF}$ are not ruptured, the read current $I_{RD}$ does not flow through the corresponding fins 352, 354 and 358.

Similarly, if the gate dielectric layer 368 of the antifuse transistor $M_{FIN\_AF}$ is ruptured, the read path (i.e., the second bit line $BL_2$) generates a higher read current $I_{RD}$ when the read action is performed. The operating principles are similar to those mentioned above, and not redundantly described herein.

As shown in FIG. 7D, the gate dielectric layer 362 of the antifuse transistor $M_{FIN\_AF}$ is ruptured, and the region between the fin 352 and the gate layer 360 has a low resistance value. However, the fin 352 is not electrically connected with the drain/source contact layer 338. That is, the fin 352 is not connected with the second following transistor $M_{FIN\_FL2}$. Under this circumstance, no read current is generated by the OTP memory cell. That is, the magnitude of the current flowing through the read path between the antifuse control line AF and the second bit line $BL_2$ is nearly zero.

Similarly, if the gate dielectric layer 364 of the antifuse transistor $M_{FIN\_AF}$ is ruptured, the read current $I_{RD}$ on the read path (i.e., the second bit line $BL_2$) is nearly zero when the read action is performed. The operating principles are similar to those mentioned above, and not redundantly described herein.

As mentioned above, the read action is performed after the enroll action is completed. When the read action is performed, one bit of a random code can be determined according to the magnitude of the read current $I_{RD}$ in the second bit line $BL_2$. For example, a current comparator is provided. The current comparator receives the read current $I_{RD}$ and a reference current Iref. If the magnitude of the read current $I_{RD}$ is higher than the magnitude of the reference current Iref, a first logic value (e.g., "0") is determined as the random code. Whereas, if the magnitude of the read current $I_{RD}$ is lower than the magnitude of the reference current Iref, a second logic value (e.g., "1") is determined as the random code.

As mentioned above, the present invention provides the OTP memory cell using the PUF technology. In the OTP memory cell, the antifuse transistor $M_{FIN\_AF}$ is a FinFET transistor. For example, the antifuse transistor $M_{FIN\_AF}$ of the OTP memory cell in FIG. 6A comprises four fins 352, 354, 356 and 358. These fins are divided into two groups. The first terminals of the fins 356 and 358 in the first group are electrically connected with the drain/source contact layer 339. The second terminals of the fins 356 and 358 in the first group are electrically connected with the drain/source contact layer 338. The first terminals of the fins 352 and 354 in the second group are electrically contacted with the drain/source contact layer 339. However, the second terminals of the fins 352 and 354 in the second group are not electrically connected with the drain/source contact layer 338.

If one of the gate dielectric layers 366 and 368 covering the fins 356 and 358 in the first group is ruptured after the enroll action is completed, the implementation of the read action can confirm that the one-bit random code has the first logic value (e.g., "0") according to the magnitude of the read current $I_{RD}$. Whereas, if one of the gate dielectric layers 362 and 364 covering the fins 352 and 354 in the second group is ruptured after the enroll action is completed, the implementation of the read action can confirm that the one-bit random code has the second logic value (e.g., "1") according to the magnitude of the read current $I_{RD}$.

In the OTP memory cell of the fourth embodiment, each of the first select transistor $M_{FIN\_sel1}$ the first following transistor $M_{FIN\_FL1}$ and the antifuse transistor $M_{FIN\_AF}$ has four fins, and each of the second select transistor $M_{FIN\_sel2}$ and the second following transistor $M_{FIN\_FL2}$ has two fins. It is noted that numerous modifications and alterations may be made while retaining the teachings of the invention. For example, in some other embodiments, the first select transistor $M_{FIN\_sel1}$ has X fins, the second select transistor $M_{FIN\_sel2}$ has Y fins, the antifuse transistor $M_{FIN\_AF}$ has Z fins, the first following transistor $M_{FIN\_FL1}$ has V fins, and the second following transistor $M_{FIN\_FL2}$ has W fins. Moreover, the Z fins of the antifuse transistor $M_{FIN\_AF}$ are divided into a first group and a second group. The first following transistor $M_{FIN\_FL1}$ is electrically connected with the first group of fins and the second group of fins in the antifuse transistor $M_{FIN\_AF}$. The second following transistor $M_{FIN\_FL2}$ is electrically connected with the first group of fins in the antifuse transistor $M_{FIN\_AF}$ only.

For example, in a variant example of the OTP memory cell of the fourth embodiment, the first select transistor $M_{FIN\_sel1}$ has 1 fin (X=1), the second select transistor $M_{FIN\_sel2}$ has 1 fin (Y=1), the first following transistor $M_{FIN\_FL1}$ has 1 fin (V=1), the second following transistor $M_{FIN\_FL2}$ has 1 fin (W=1), and the antifuse transistor $M_{FIN\_AF}$ has two fins (Z=2). Due to this structural design, the OTP memory cell using the PUF technology has the smallest size.

Figure 8:
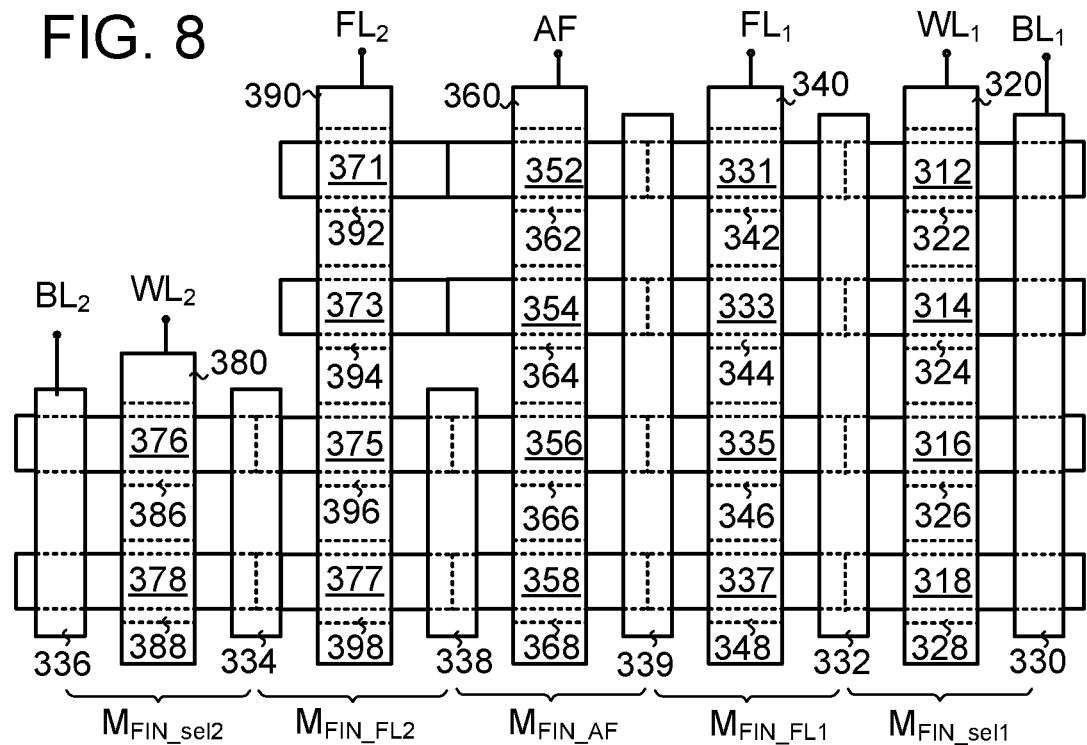
FIG. 8 is a schematic top view illustrating the structure of an OTP memory cell using a PUF technology according to a fifth embodiment of the present invention.

FIG. 8 is a schematic top view illustrating the structure of an OTP memory cell using a PUF technology according to a fifth embodiment of the present invention. In comparison with the OTP memory cell of the fourth embodiment as shown in FIG. 6A, the second following transistor $M_{FIN\_FL2}$ in the OTP memory cell of this embodiment further comprises two additional fins 371 and 373 and two corresponding gate dielectric layers 392 and 394. For succinctness, only the two additional fins 371 and 373 and the gate dielectric layers 392 and 394 of the second following transistor $M_{FIN\_FL2}$ will be described as follows.

As shown in FIG. 8, the gate structure of the second following transistor $M_{FIN\_FL2}$ further comprises the gate dielectric layers 392 and 394. The gate dielectric layers 392 and 394 cover the top surfaces and the lateral surfaces of the central regions of the fins 371 and 373, respectively. The gate layer 390 also covers the gate dielectric layers 392 and 394. Moreover, the second terminal of the fin 352 of the antifuse transistor $M_{FIN\_AF}$ is electrically connected with the first terminal of the fin 371 of the second following transistor $M_{FIN\_FL2}$. Similarly, the second terminal of the fin 354 of the antifuse transistor $M_{FIN\_AF}$ is electrically connected with the first terminal of the fin 373 of the second following transistor $M_{FIN\_FL2}$.

Figure 9:
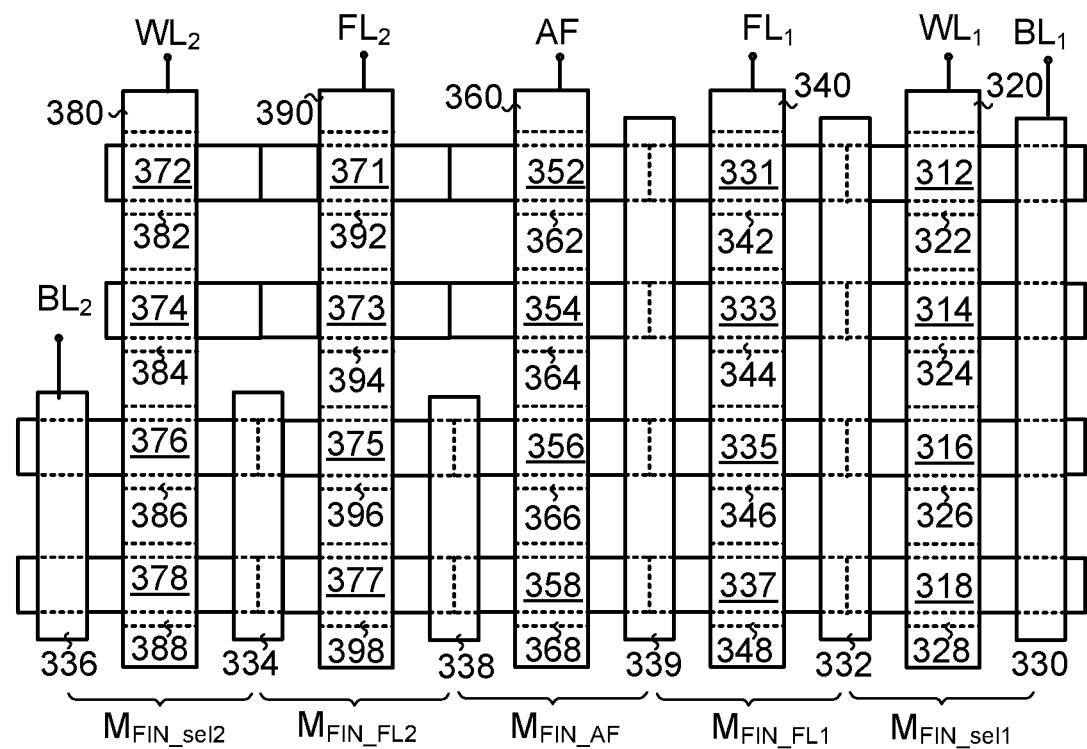
FIG. 9 is a schematic top view illustrating the structure of an OTP memory cell using a PUF technology according to a sixth embodiment of the present invention.

FIG. 9 is a schematic top view illustrating the structure of an OTP memory cell using a PUF technology according to a sixth embodiment of the present invention. In comparison with the OTP memory cell of the fourth embodiment as shown in FIG. 6A, the second following transistor $M_{FIN\_FL2}$ in the OTP memory cell of this embodiment further comprises two additional fins 371 and 373 and two corresponding gate dielectric layers 392 and 394, and the second select transistor $M_{FIN\_sel2}$ in the OTP memory cell of this embodiment further comprises two additional fins 372 and 374 and two corresponding gate dielectric layers 382 and 384. For succinctness, only the two additional fins 371 and 373 and the gate dielectric layers 392 and 394 of the second following transistor $M_{FIN\_FL2}$ and two additional fins 372 and 374 and the gate dielectric layers 382 and 384 of the second select transistor $M_{FIN\_sel2}$ will be described as follows.

As shown in FIG. 9, the gate structure of the second following transistor $M_{FIN\_FL2}$ further comprises the gate dielectric layers 392 and 394. The gate dielectric layers 392 and 394 cover the top surfaces and the lateral surfaces of the central regions of the fins 371 and 373, respectively. The gate layer 390 also covers the gate dielectric layers 392 and 394. Moreover, the second terminal of the fin 352 of the antifuse transistor $M_{FIN\_AF}$ is electrically connected with the first terminal of the fin 371 of the second following transistor $M_{FIN\_FL2}$. Similarly, the second terminal of the fin 354 of the antifuse transistor $M_{FIN\_AF}$ is electrically connected with the first terminal of the fin 373 of the second following transistor $M_{FIN\_FL2}$.

Moreover, the gate structure of the second select transistor $M_{FIN\_sel2}$ further comprises the gate dielectric layers 382 and 384. The gate dielectric layers 382 and 384 cover the top surfaces and the lateral surfaces of the central regions of the fins 372 and 374, respectively. The gate layer 380 also covers the gate dielectric layers 382 and 384. Moreover, the second terminal of the fin 371 of the second following transistor $M_{FIN\_FL2}$ is electrically connected with the first terminal of the fin 372 of the second select transistor $M_{FIN\_sel2}$. Similarly, the second terminal of the fin 373 of the second following transistor $M_{FIN\_FL2}$ is electrically connected with the first terminal of the fin 374 of the second select transistor $M_{FIN\_sel2}$.

Figure 10:
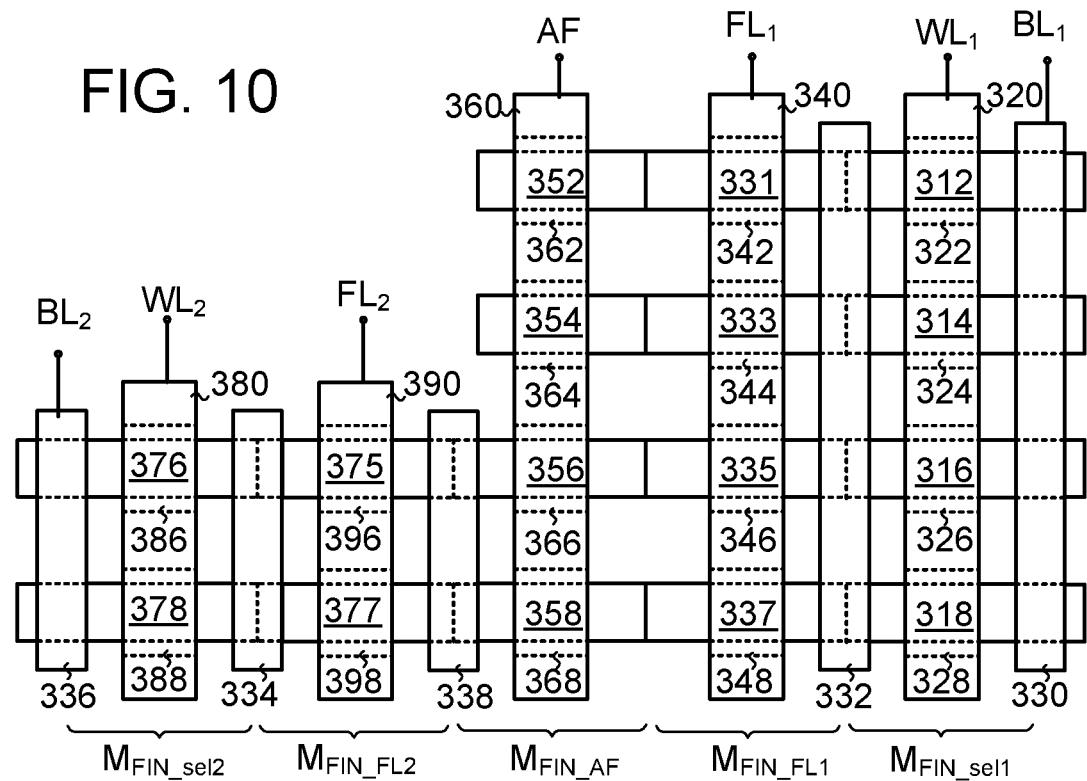

FIG. 10 is a schematic top view illustrating the structure of an OTP memory cell using a PUF technology according to a seventh embodiment of the present invention. In comparison with the OTP memory cell of the fourth embodiment as shown in FIG. 6A, the OTP memory cell of this embodiment is not equipped with the drain/source contact layer 339. The other structures of the OTP memory cell of this embodiment are similar to those of OTP memory cell of the fourth embodiment, and not redundantly described herein.

As shown in FIG. 10, the second terminal of the fin 331 of the first following transistor $M_{FIN\_FL1}$ is electrically connected with the first terminal of the fin 352 of the antifuse transistor $M_{FIN\_AF}$. Similarly, the second terminal of the fin 333 of the first following transistor $M_{FIN\_FL1}$ is electrically connected with the first terminal of the fin 354 of the antifuse transistor $M_{FIN\_AF}$. Similarly, the second terminal of the fin 335 of the first following transistor $M_{FIN\_FL1}$ is electrically connected with the first terminal of the fin 356 of the antifuse transistor $M_{FIN\_AF}$. Similarly, the second terminal of the fin 337 of the first following transistor $M_{FIN\_FL1}$ is electrically connected with the first terminal of the fin 358 of the antifuse transistor $M_{FIN\_AF}$.

In the OTP memory cell of the seventh embodiment, the first terminals of the fins 352, 354, 356 and 358 of the antifuse transistor $M_{FIN\_AF}$ are not electrically connected with each other. Consequently, when the read action is performed, the OTP memory cell is capable of preventing the fins 352 and 354 not on the read path from generating a leakage current to the second bit line $BL_2$. In other words, the misjudgment of the read result will be avoided.

The methods of performing the enroll action and the read action on the OTP memory cell of FIG. 8, the OTP memory cell of FIG. 9 and the OTP memory cell of FIG. 10 are similar to those of FIG. 5. When the enroll action is performed on the OTP memory cell of FIG. 8, FIG. 9 or FIG. 10, the bias voltages described in FIG. 7A and FIG. 7B are provided to the OTP memory cell. Moreover, when the read action is performed on the OTP memory cell of FIG. 8, FIG. 9 or FIG. 10, the bias voltages described in FIG. 7C and FIG. 7D are provided to the OTP memory cell.

In the fourth, fifth, sixth and seventh embodiments, the OTP memory cell is composed of five FinFET transistors. In a variant example of the OTP memory cell of the fourth embodiment, the fifth embodiment, the sixth embodiment or the seventh embodiment, only the antifuse transistor is implemented with the FinFET transistor, but the select transistors and the following transistors are implemented with other appropriate transistors such as planar field-effect transistors (also referred as planar FET transistors). For example, in another embodiment, the antifuse transistor $M_{GAA\_AF}$ with the structure of the FinFET transistor as shown in FIG. 6A, two select transistors with the structures of the planar field-effect transistors and two following transistors with the structures of the planar field-effect transistors are collaboratively formed as the OTP memory cell of the present invention.

Take the antifuse transistor $M_{FIN\_AF}$ with the structure of the FinFET transistor as shown in FIG. 6A for example. The first drain/source terminal of the first select transistor is connected with the first bit line $BL_1$. The gate terminal of the first select transistor is connected with the first word line $WL_1$. The second drain/source terminal of the first select transistor is connected with the first drain/source terminal of the first following transistor. The gate terminal of the first following transistor is connected with the first following control line $FL_1$. The second drain/source terminal of the first following transistor is connected with the drain/source contact layer 339 of the antifuse transistor $M_{FIN\_AF}$. The first drain/source terminal of the second following transistor is connected with the drain/source contact layer 338 of the antifuse transistor $M_{FIN\_AF}$. The gate terminal of the second following transistor is connected with the second following control line $FL_2$. The second drain/source terminal of the second following transistor is connected with the first drain/source terminal of the second select transistor. The gate terminal of the second select transistor is connected with the second word line $WL_2$. The second drain/source terminal of the second select transistor is connected with the second bit line $BL_2$.

Figure 11:
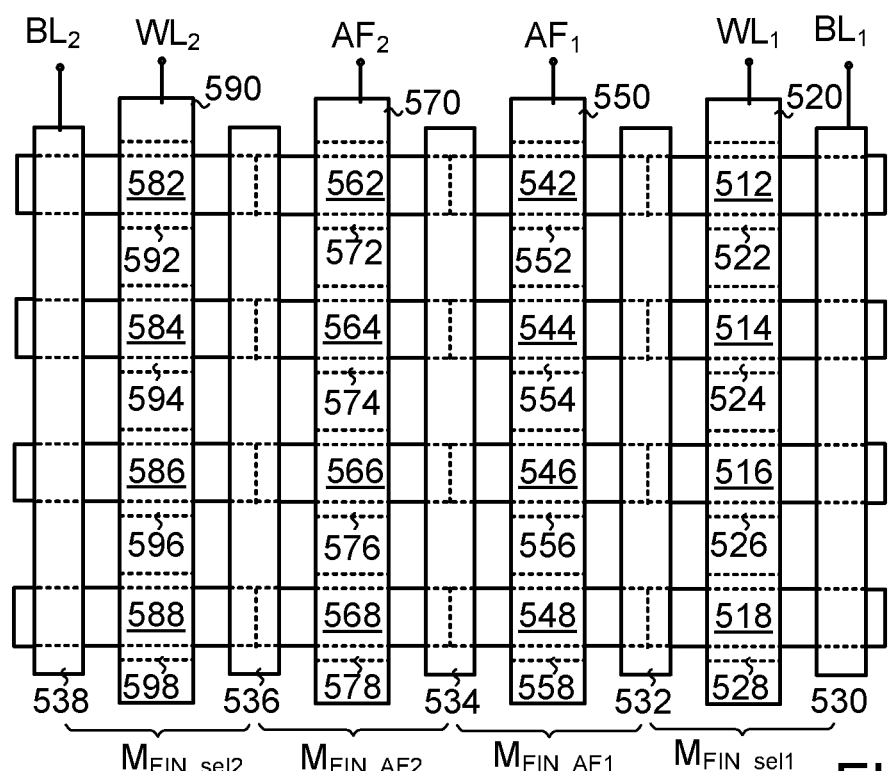
FIG. 11 is a schematic top view illustrating the structure of an OTP memory cell using a PUF technology according to an eighth embodiment of the present invention.

FIG. 11 is a schematic top view illustrating the structure of an OTP memory cell using a PUF technology according to an eighth embodiment of the present invention. In the eighth embodiment, the OTP memory cell comprises five FinFET transistors. The structure of each of the three FinFET transistors is similar to that of FIG. 1D, and not redundantly described herein. In this embodiment, the OTP memory cell comprises a first select transistor $M_{FIN\_sel1}$, a second select transistor $M_{FIN\_sel2}$, a first antifuse transistor $M_{FIN\_AF1}$ and a second antifuse transistor $M_{FIN\_AF2}$.

The first select transistor $M_{FIN\_sel1}$ comprises a drain/source contact layer 530, a drain/source contact layer 532, a gate structure and four fins 512, 514, 516 and 518. The gate structure covers the central regions of the fins 512, 514, 516 and 518. The gate structure comprises gate dielectric layers 522, 524, 526 and 528 and a gate layer 520. The gate dielectric layers 522, 524, 526 and 528 cover the top surfaces and the lateral surfaces of the central regions of the fins 512, 514, 516 and 518, respectively. The gate layer 520 covers the gate dielectric layers 522, 524, 526 and 528. The drain/source contact layer 530 is contacted with the top surfaces of the first side regions of the fins 512, 514, 516 and 518. The drain/source contact layer 532 is contacted with the top surfaces of the second side regions of the fins 512, 514, 516 and 518. In other words, the first terminals of the fins 512, 514, 516 and 518 are electrically connected with the drain/source contact layer 530, and the second terminals of the fins 512, 514, 516 and 518 are electrically connected with the drain/source contact layer 532.

The first antifuse transistor $M_{FIN\_AF1}$ comprises the drain/source contact layer 532, a drain/source contact layer 534, a gate structure and four fins 542, 544, 546 and 548. The gate structure covers the central regions of the fins 542, 544, 546 and 548. The gate structure comprises gate dielectric layers 552, 554, 556 and 558 and a gate layer 550. The gate dielectric layers 552, 554, 556 and 558 cover the top surfaces and the lateral surfaces of the central regions of the fins 542, 544, 546 and 548, respectively. The gate layer 550 covers the gate dielectric layers 552, 554, 556 and 558. The drain/source contact layer 532 is contacted with the top surfaces of the first side regions of the fins 542, 544, 546 and 548. The drain/source contact layer 534 is contacted with the top surfaces of the second side regions of the fins 542, 544, 546 and 548. In other words, the first terminals of the fins 542, 544, 546 and 548 are electrically connected with the drain/source contact layer 532, and the second terminals of the fins 542, 544, 546 and 548 are electrically connected with the drain/source contact layer 534.

As shown in FIG. 11, the first terminal of the fin 542 of the first antifuse transistor $M_{FIN\_AF1}$ is electrically connected with the second terminal of the fin 512 of the first select transistor $M_{FIN\_sel1}$. Similarly, the first terminals of the fins 544, 546 and 548 of the first antifuse transistor $M_{FIN\_AF1}$ are electrically connected with the second terminals of the fins 514, 516 and 518 of the first select transistor $M_{FIN\_sel1}$, respectively.

The second antifuse transistor $M_{FIN\_AF2}$ comprises the drain/source contact layer 534, a drain/source contact layer 536, a gate structure and four fins 562, 564, 566 and 568. The gate structure covers the central regions of the fins 562, 564, 566 and 568. The gate structure comprises gate dielectric layers 572, 576, 576 and 578 and a gate layer 570. The gate dielectric layers 572, 576, 576 and 578 cover the top surfaces and the lateral surfaces of the central regions of the fins 562, 564, 566 and 568, respectively. The gate layer 570 covers the gate dielectric layers 572, 574, 576 and 578. The drain/source contact layer 534 is contacted with the top surfaces of the first side regions of the fins 562, 564, 566 and 568. The drain/source contact layer 536 is contacted with the top surfaces of the second side regions of the fins 562, 564, 566 and 568.

As shown in FIG. 11, the first terminal of the fin 562 of the second antifuse transistor $M_{FIN\_AF2}$ is electrically connected with the second terminal of the fin 542 of the first antifuse transistor $M_{FIN\_AF1}$. Similarly, the first terminals of the fins 564, 566 and 568 of the second antifuse transistor $M_{FIN\_AF2}$ are electrically connected with the second terminals of the fins 544, 546 and 548 of the first antifuse transistor $M_{FIN\_AF1}$, respectively.

The second select transistor $M_{FIN\_sel2}$ comprises the drain/source contact layer 536, a drain/source contact layer 538, a gate structure and four fins 582, 584, 586 and 588. The gate structure covers the central regions of the fins 582, 584, 586 and 588. The gate structure comprises gate dielectric layers 592, 598, 596 and 598 and a gate layer 590. The gate dielectric layers 592, 598, 596 and 598 cover the top surfaces and the lateral surfaces of the central regions of the fins 582, 584, 586 and 588, respectively. The gate layer 590 covers the gate dielectric layers 592, 598, 596 and 598. The drain/source contact layer 536 is contacted with the top surfaces of the first side regions of the fins 582, 584, 586 and 588. The drain/source contact layer 538 is contacted with the top surfaces of the second side regions of the fins 582, 584, 586 and 588.

As shown in FIG. 11, the first terminal of the fin 582 of the second select transistor $M_{FIN\_sel2}$ is electrically connected with the second terminal of the fin 562 of the second antifuse transistor $M_{FIN\_AF2}$. Similarly, the first terminals of the fins 584, 586 and 588 of the second select transistor $M_{FIN\_sel2}$ are electrically connected with the second terminals of the fins 564, 566 and 568 of the second antifuse transistor $M_{FIN\_AF2}$, respectively.

It is noted that the structure of the OTP memory cell of the eighth embodiment may be modified. In a variant example of the eighth embodiment, the fins 512, 542, 562 and 582 are integrally formed. Similarly, the fins 514, 544, 564 and 584 are integrally formed. Similarly, the fins 516, 546, 566 and 586 are integrally formed. Similarly, the fins 518, 548, 568 and 588 are integrally formed.

In the first select transistor $M_{FIN\_sel1}$, the drain/source contact layer 530 is connected with a first bit line $BL_1$, and the gate layer 520 is connected with a first word line $WL_1$. In the first antifuse transistor $M_{FIN\_AF1}$, the gate layer 550 is connected with a first antifuse control line $AF_1$. In the second antifuse transistor $M_{FIN\_AF2}$, the gate layer 570 is connected with a second antifuse control line $AF_2$. In the second select transistor $M_{FIN\_sel2}$, the drain/source contact layer 538 is connected with a second bit line $BL_2$, and the gate layer 590 is connected with a second word line $WL_2$.

Figure 12A:
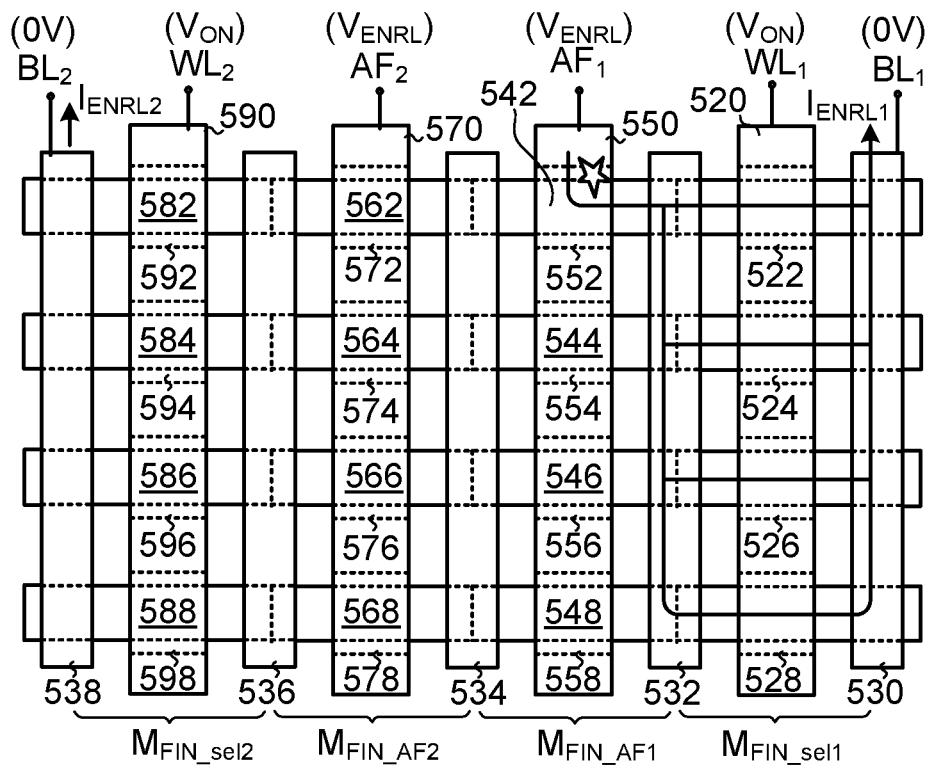
FIG. 12A and FIG. 12B schematically illustrate associated bias voltages for performing an enroll action on the OTP memory cell according to the eighth embodiment of the present invention.
Figure 12B:
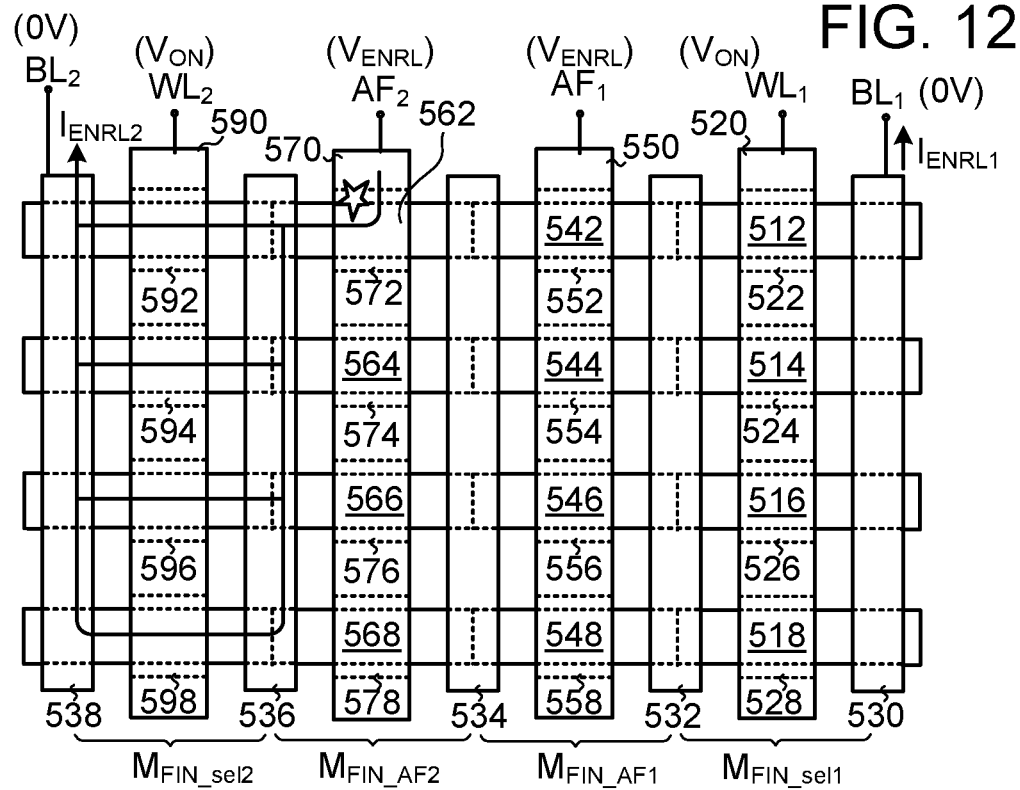
Figure 12C:
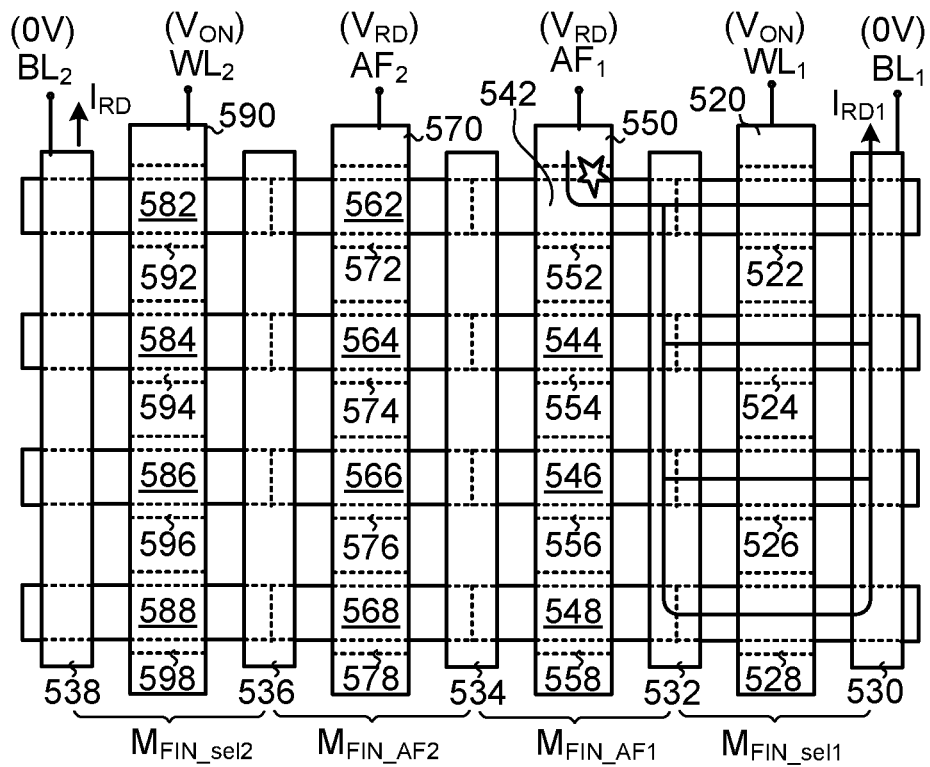
FIG. 12C and FIG. 12D schematically illustrate associated bias voltages for performing a read action on the OTP memory cell according to the eighth embodiment of the present invention.
Figure 12D:
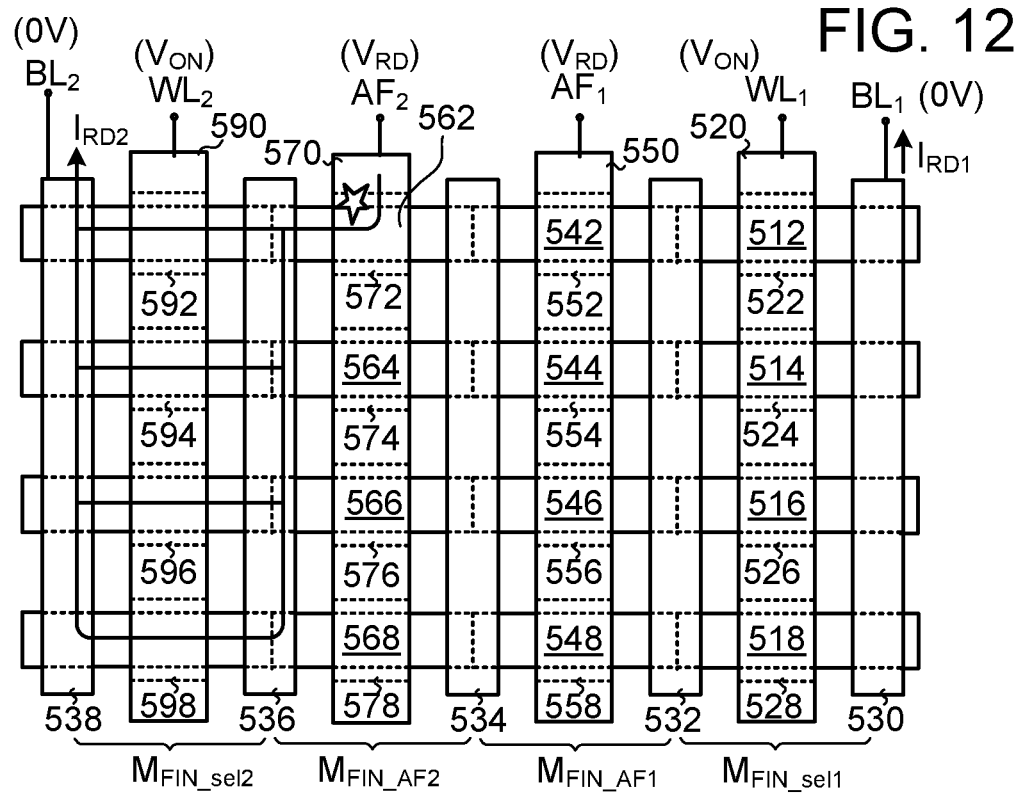

FIG. 12A and FIG. 12B schematically illustrate associated bias voltages for performing an enroll action on the OTP memory cell according to the eighth embodiment of the present invention. FIG. 12C and FIG. 12D schematically illustrate associated bias voltages for performing a read action on the OTP memory cell according to the eighth embodiment of the present invention.

When the enroll action is performed, the region between the first antifuse control line $AF_1$ and the first bit line $BL_1$ is a first enroll path, and the second antifuse control line $AF_2$ and the second bit line $BL_2$ is a second enroll path. Moreover, when the enroll action is performed, the first bit line $BL_1$ receives a ground voltage (0V), the first word line $WL_1$ receives an on voltage $V_{ON}$, the second word line $WL_2$ receives the on voltage Von, the first antifuse control line $AF_1$ receives an enroll voltage $V_{ENRL}$, the second antifuse control line $AF_2$ receives the enroll voltage $V_{ENRL}$, and the second bit line $BL_2$ receives the ground voltage (0V). For example, the enroll voltage $V_{ENRL}$ is in the range between 3V and 6V, and the on voltage $V_{ON}$ is in the range between 0.4V and 3V. Under this circumstance, the first select transistor $M_{FIN\_sel1}$ and the second select transistor $M_{FIN\_sel2}$ are turned on. That is, the first enroll path and the second enroll path are turned on.

Since the first select transistor $M_{FIN\_sel1}$ is turned on, the ground voltage (0V) of the first bit line $BL_1$ is transmitted to the drain/source contact layer 532 and the fins 542, 544, 546 and 548 of the first antifuse transistor $M_{FIN\_AF1}$ through the first select transistor $M_{FIN\_sel1}$. Moreover, since the second select transistor $M_{FIN\_sel2}$ is turned on, the ground voltage (0V) of the second bit line $BL_2$ is transmitted to the drain/source contact layer 536 and the fins 562, 564, 566 and 568 of the second antifuse transistor $M_{FIN\_AF2}$ through the second select transistor $M_{FIN\_sel2}$. Consequently, when the first antifuse control line $AF_1$ and the second antifuse control line $AF_2$ receive the enroll voltage $V_{ENRL}$, the voltage stress between the fins 542, 544, 546 and 548 and the gate layer 550 of the first antifuse transistor $M_{FIN\_AF1}$ is equal to the enroll voltage $V_{ENRL}$. Moreover, the voltage stress between the fins 562, 564, 566 and 568 and the gate layer 570 of the second antifuse transistor $M_{FIN\_AF2}$ is equal to the enroll voltage $V_{ENRL}$. Under this circumstance, one of the eight gate dielectric layers 552, 554, 556, 558, 572, 574, 576 and 578 is ruptured.

Due to the process variation of the OTP memory cell, it is unable to predict which of the gate dielectric layers 552, 554, 556, 558, 572, 574, 576 and 578 of the first antifuse transistor $M_{FIN\_AF1}$ and the second antifuse transistor $M_{FIN\_AF2}$ is ruptured when the enroll action is performed. Consequently, the PUF technology can be applied to the OTP memory cell of the eighth embodiment.

For example, in the OTP memory cell as shown in FIG. 12A, the gate dielectric layer 552 of the first antifuse transistor $M_{FIN\_AF1}$ is ruptured after the enroll action is completed. Consequently, a first enroll current $I_{ENRL1}$ is generated. The first enroll current $I_{ENRL1}$ flows from the first antifuse control line $AF_1$ to the first bit line $BL_1$ through the gate layer 550, the gate dielectric layer 552, the fin 542, the drain/source contact layer 532 and the first select transistor $M_{FIN\_sel1}$. Since the gate dielectric layer 552 is ruptured, the region between the gate layer 550 and the fin 542 has a low resistance value. Moreover, since the gate dielectric layers 572, 574, 576 and 578 of the second antifuse transistor $M_{FIN\_AF2}$ are not ruptured, a second enroll current $I_{ENRL2}$ in the second bit line $BL_2$ is very low (e.g., nearly zero).

Similarly, if one of the other gate dielectric layers 544, 546 and 548 of the first antifuse transistor $M_{FIN\_AF1}$ is ruptured when the enroll action is performed, the magnitude of the first enroll current $I_{ENRL1}$ in the first bit line $BL_1$ is higher than the magnitude of the second enroll current $I_{ENRL2}$ in the second bit line $BL_2$.

Please refer to FIG. 12B. The gate dielectric layer 572 of the second antifuse transistor $M_{FIN\_AF2}$ is ruptured after the enroll action is completed. Consequently, the second enroll current $I_{ENRL2}$ is generated. The second enroll current $I_{ENRL2}$ flows from the second antifuse control line $AF_2$ to the second bit line $BL_2$ through the gate layer 570, the gate dielectric layer 572, the fin 562, the drain/source contact layer 536 and the second select transistor $M_{FIN\_sel2}$. Since the gate dielectric layer 572 is ruptured, the region between the gate layer 570 and the fin 562 has a low resistance value. Moreover, since the gate dielectric layers 552, 554, 556 and 558 of the first antifuse transistor $M_{FIN\_AF1}$ are not ruptured, the first enroll current $I_{ENRL1}$ in the first bit line $BL_1$ is very low (e.g., nearly zero).

Similarly, if one of the other gate dielectric layers 564, 566 and 568 of the second antifuse transistor $M_{FIN\_AF2}$ is ruptured when the enroll action is performed, the magnitude of the second enroll current $I_{ENRL2}$ in the second bit line $BL_2$ is higher than the magnitude of the first enroll current $I_{ENRL1}$ in the first bit line $BL_1$.

When the read action is performed, the region between the first antifuse control line $AF_1$ and the first bit line $BL_1$ is a first read path, and the second antifuse control line $AF_2$ and the second bit line $BL_2$ is a second read path. Moreover, when the read action is performed, the first bit line $BL_1$ receives the ground voltage (0V), the first word line $WL_1$ receives the on voltage $V_{ON}$, the second word line $WL_2$ receives the on voltage $V_{ON}$, the first antifuse control line $AF_1$ receives a read voltage $V_{RD}$, the second antifuse control line $AF_2$ receives the read voltage $V_{RD}$, and the second bit line $BL_2$ receives the ground voltage (0V). For example, the read voltage $V_{RD}$ is in the range between 0.75V and 1.2V. Under this circumstance, the first select transistor $M_{FIN\_sel1}$ and the second select transistor $M_{FIN\_sel1}$ are turned on. That is, the first read path and the second read path are turned on.

For example, in the OTP memory cell as shown in FIG. 12C, the gate dielectric layer 552 of the first antifuse transistor $M_{FIN\_AF1}$ is ruptured. When the read action is performed, a higher first read current $I_{RD1}$ flows from the first antifuse control line $AF_1$ to the first bit line $BL_1$ through the gate layer 550, the gate dielectric layer 552, the fin 542, the drain/source contact layer 532 and the first select transistor $M_{FIN\_sel1}$. Moreover, since the gate dielectric layers 572, 574, 576 and 578 of the second antifuse transistor $M_{FIN\_AF2}$ are not ruptured, a second read current $I_{RD2}$ in the second bit line $BL_2$ is very low (e.g., nearly zero).

That is, if one of the other gate dielectric layers 552, 554, 556 and 558 of the first antifuse transistor $M_{FIN\_AF1}$ is ruptured when the read action is performed, the magnitude of the first read current $I_{RD1}$ in the first bit line $BL_1$ is higher than the magnitude of the second read current $I_{RD2}$ in the second bit line $BL_2$.

For example, in the OTP memory cell as shown in FIG. 12D, the gate dielectric layer 572 of the second antifuse transistor $M_{FIN\_AF2}$ is ruptured. When the read action is performed, a higher second read current $I_{RD2}$ flows from the second antifuse control line $AF_2$ to the second bit line $BL_2$ through the gate layer 570, the gate dielectric layer 572, the fin 562, the drain/source contact layer 536 and the second select transistor $M_{FIN\_sel2}$. Moreover, since the gate dielectric layers 522, 554, 556 and 558 of the first antifuse transistor $M_{FIN\_AF1}$ are not ruptured, a first read current $I_{RD1}$ in the first bit line $BL_1$ is very low (e.g., nearly zero).

That is, if one of the other gate dielectric layers 572, 574, 576 and 578 of the second antifuse transistor $M_{FIN\_AF2}$ is ruptured when the read action is performed, the magnitude of the second read current $I_{RD2}$ in the second bit line $BL_2$ is higher than the magnitude of the first read current $I_{RD1}$ in the first bit line $BL_1$.

As mentioned above, the read action is performed after the enroll action is completed. When the read action is performed, one bit of a random code can be determined according to the magnitude of the first read current $I_{RD1}$ in the first bit line $BL_1$ and the magnitude of the second read current $I_{RD2}$ in the second bit line $B_{L2}$. For example, a current comparator is provided. The current comparator receives the first read current $I_{RD1}$ and the second read current $I_{RD2}$. If the magnitude of the first read current $I_{RD1}$ is higher than the magnitude of the second read current $I_{RD2}$, a first logic value (e.g., "0") is determined as the random code. Whereas, if the magnitude of the first read current $I_{RD1}$ is lower than the magnitude of the second read current $I_{RD2}$, a second logic value (e.g., "1") is determined as the random code.

Alternatively, when the read action is performed, one bit of a random code can be determined according to the magnitude of the first read current $I_{RD1}$ in the first bit line $BL_1$ or the magnitude of the second read current $I_{RD2}$ in the second bit line $BL_2$. For example, a current comparator is provided. The current comparator receives the first read current $I_{RD1}$ and the reference current Iref. If the magnitude of the first read current $I_{RD1}$ is higher than the magnitude of the reference current Iref, a first logic value (e.g., "0") is determined as the random code. Whereas, if the magnitude of the first read current $I_{RD1}$ is lower than the magnitude of the reference current Iref, a second logic value (e.g., "1") is determined as the random code.

In the OTP memory cell of the eighth embodiment, each of the first select transistor $M_{FIN\_sel1}$, the second select transistor $M_{FIN\_sel2}$, the first antifuse transistor $M_{FIN\_AF1}$ and the second antifuse transistor $M_{FIN\_AF2}$ has four fins. It is noted that numerous modifications and alterations may be made while retaining the teachings of the invention. For example, in some other embodiments, the first select transistor $M_{FIN\_sel1}$ has X fins, the second select transistor $M_{FIN\_sel2}$ has Y fins, the first antifuse transistor $M_{FIN\_AF1}$ has P fins, and the second antifuse transistor $M_{FIN\_AF2}$ has Q fins.

For example, in a variant example of the OTP memory cell of the eighth embodiment, the first select transistor $M_{FIN\_sel1}$ has 1 fin (X=1), the second select transistor $M_{FIN\_sel2}$ has 1 fin (Y=1), the first antifuse transistor $M_{FIN\_AF1}$ has 1 fin (P=1), and the second antifuse transistor $M_{FIN\_AF2}$ has 1 fin (Q=1). Due to this structural design, the antifuse-type OTP memory cell using the PUF technology has the smallest size.

In the eighth embodiment, the OTP memory cell is composed of four FinFET transistors. In a variant example of the OTP memory cell of the eighth embodiment, only the first antifuse transistor and the second antifuse transistor are implemented with the FinFET transistors, but the first select transistor and the second select transistor are implemented with other appropriate transistors such as planar field-effect transistors (also referred as planar FET transistors). For example, in another embodiment, the first antifuse transistor $M_{FIN\_AF1}$ and the second antifuse transistor $M_{FIN\_AF2}$ with the structures of the FinFET transistors and two select transistors with the structures of the planar field-effect transistors with the structures of the planar field-effect transistors are collaboratively formed as the OTP memory cell of the present invention.

Take the OTP memory cell as shown in FIG. 11 for example. The first drain/source terminal of the first select transistor is connected with the first bit line $BL_1$. The gate terminal of the first select transistor is connected with the first word line $WL_1$. The second drain/source terminal of the first select transistor is connected with the drain/source contact layer 532 of the first antifuse transistor $M_{FIN\_AF1}$. The first drain/source terminal of the second select transistor is connected with the drain/source contact layer 536 of the second antifuse transistor $M_{FIN\_AF2}$. The gate terminal of the second select transistor is connected with the second word line $WL_2$. The second drain/source terminal of the second select transistor is connected with the second bit line $BL_2$.

Figure 13:
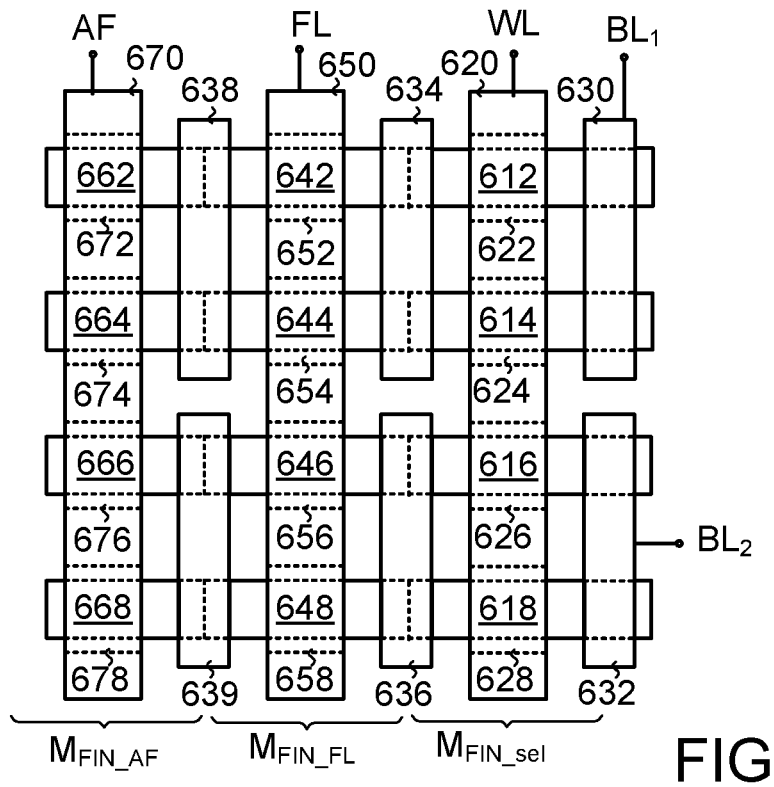
FIG. 13 is a schematic top view illustrating the structure of an OTP memory cell using a PUF technology according to a ninth embodiment of the present invention.

FIG. 13 is a schematic top view illustrating the structure of an OTP memory cell using a PUF technology according to a ninth embodiment of the present invention. In this embodiment, the OTP memory cell comprises three FinFET transistors. The structure of each of the three FinFET transistors is similar to that of FIG. 1D, and not redundantly described herein. The OTP memory cell comprises a select transistor $M_{FIN\_sel}$, a following transistor $M_{FIN}$ FL and an antifuse transistor $M_{FIN\_AF}$.

The select transistor $M_{FIN\_sel}$ comprises a drain/source contact layer 630, a drain/source contact layer 632, a drain/source contact layer 634, a drain/source contact layer 636, a gate structure and four fins 612, 614, 616 and 618. The gate structure covers the central regions of the fins 612, 614, 616 and 618. The gate structure comprises gate dielectric layers 622, 624, 626 and 628 and a gate layer 620. The gate dielectric layers 622, 624, 626 and 628 cover the top surfaces and the lateral surfaces of the central regions of the fins 612, 614, 616 and 618, respectively. The gate layer 620 covers the gate dielectric layers 622, 624, 626 and 628. The drain/source contact layer 630 is contacted with the top surfaces of the first side regions of the fins 612 and 614. The drain/source contact layer 634 is contacted with the top surfaces of the second side regions of the fins 612 and 614. The drain/source contact layer 632 is contacted with the top surfaces of the first side regions of the fins 616 and 618. The drain/source contact layer 636 is contacted with the top surfaces of the second side regions of the fins 616 and 618. In other words, the first terminals of the fins 612 and 614 are electrically connected with the drain/source contact layer 630, the second terminals of the fins 612 and 614 are electrically connected with the drain/source contact layer 634, the first terminals of the fins 616 and 618 are electrically connected with the drain/source contact layer 632, and the second terminals of the fins 616 and 618 are electrically connected with the drain/source contact layer 636.

The following transistor $M_{FIN\_FL}$ comprises the drain/source contact layer 634, the drain/source contact layer 636, a drain/source contact layer 638, a drain/source contact layer 639, a gate structure and four fins 642, 644, 646 and 648. The gate structure covers the central regions of the fins 642, 644, 646 and 648. The gate structure comprises gate dielectric layers 652, 654, 656 and 658 and a gate layer 650. The gate dielectric layers 652, 654, 656 and 658 cover the top surfaces and the lateral surfaces of the central regions of the fins 642, 644, 646 and 648, respectively. The gate layer 650 covers the gate dielectric layers 652, 654, 656 and 658. The drain/source contact layer 634 is contacted with the top surfaces of the first side regions of the fins 642 and 644. The drain/source contact layer 638 is contacted with the top surfaces of the second side regions of the fins 642 and 644. The drain/source contact layer 636 is contacted with the top surfaces of the first side regions of the fins 646 and 648. The drain/source contact layer 639 is contacted with the top surfaces of the second side regions of the fins 646 and 648. In other words, the first terminals of the fins 642 and 644 are electrically connected with the drain/source contact layer 634, the second terminals of the fins 642 and 644 are electrically connected with the drain/source contact layer 638, the first terminals of the fins 646 and 648 are electrically connected with the drain/source contact layer 636, and the second terminals of the fins 646 and 648 are electrically connected with the drain/source contact layer 639.

As shown in FIG. 13, the second terminal of the fin 612 of the select transistor $M_{FIN\_sel}$ is electrically connected with the first terminal of the fin 642 of the following transistor $M_{FIN\_FL}$. Similarly, the second terminals of the fins 614, 616 and 618 of the select transistor $M_{FIN\_sel}$ are electrically connected with the first terminals of the fins 644, 646 and 648 of the following transistor $M_{FIN\_FL}$, respectively.

The antifuse transistor $M_{FIN\_AF}$ comprises the drain/source contact layer 638, the drain/source contact layer 639, a gate structure and four fins 662, 664, 666 and 668. The gate structure covers the central regions of the fins 662, 664, 666 and 668. The gate dielectric layers 672, 674, 676 and 678 cover the top surfaces and the lateral surfaces of the central regions of the fins 662, 664, 666 and 668, respectively. The gate layer 670 covers the gate dielectric layers 672, 674, 676 and 678. The drain/source contact layer 638 is contacted with the top surfaces of the first side regions of the fins 662 and 664. The drain/source contact layer 639 is contacted with the top surfaces of the first side regions of the fins 666 and 668. In other words, the first terminals of the fins 662 and 664 are electrically connected with the drain/source contact layer 638, and the first terminals of the fins 666 and 668 are electrically connected with the drain/source contact layer 639.

As shown in FIG. 13, the second terminal of the fin 642 of the following transistor $M_{FIN\_FL}$ is electrically connected with the first terminal of the fin 662 of the antifuse transistor $M_{FIN\_AF}$. Similarly, the second terminals of the fins 644, 646 and 648 of the following transistor $M_{FIN\_FL}$ are electrically connected with the first terminals of the fins 664, 666 and 668 of the antifuse transistor $M_{FIN\_AF}$, respectively.

It is noted that the structure of the OTP memory cell of the ninth embodiment may be modified. In a variant example of the eighth embodiment, the fins 612, 642 and 662 are integrally formed. Similarly, the fins 614, 644 and 664 are integrally formed. Similarly, the fins 616, 646 and 666 are integrally formed. Similarly, the fins 618, 648 and 668 are integrally formed.

In the select transistor $M_{FIN\_sel}$, the drain/source contact layer 630 is connected with a first bit line $BL_1$, the drain/source contact layer 632 is connected with a second bit line $BL_2$, and the gate layer 620 is connected with a word line WL. In the following transistor $M_{FIN}$ FL, the gate layer 650 is connected with a following control line FL. In the antifuse transistor $M_{FIN\_AF}$, the gate layer 670 is connected with an antifuse control line AF.

Figure 14A:
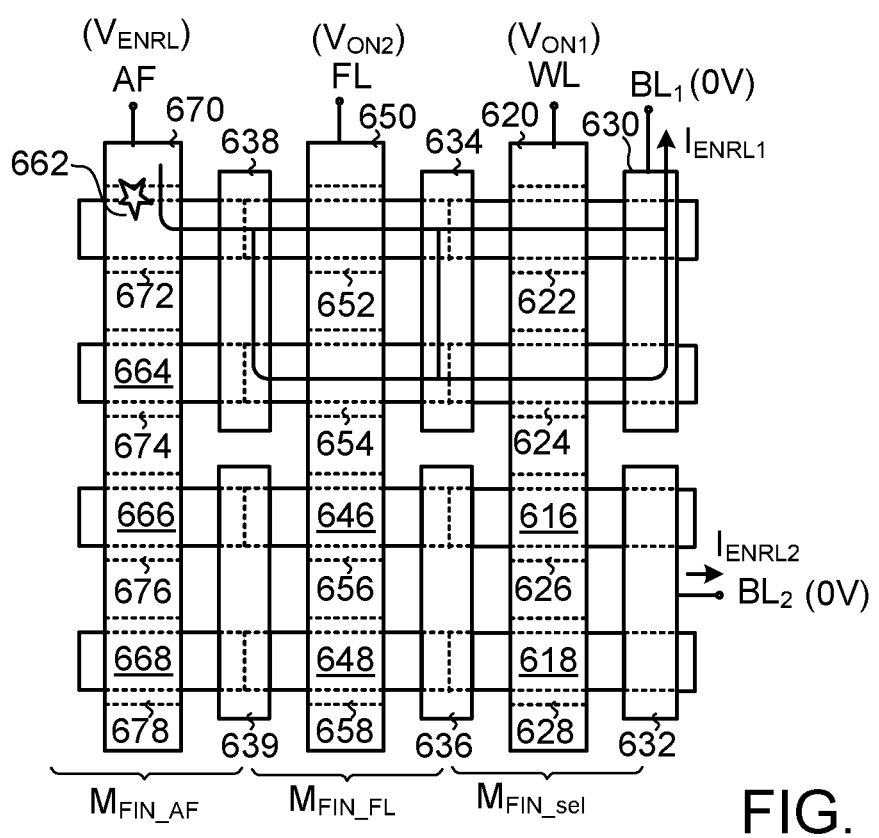
FIG. 14A and FIG. 14B schematically illustrate associated bias voltages for performing an enroll action on the OTP memory cell according to the ninth embodiment of the present invention.
Figure 14B:
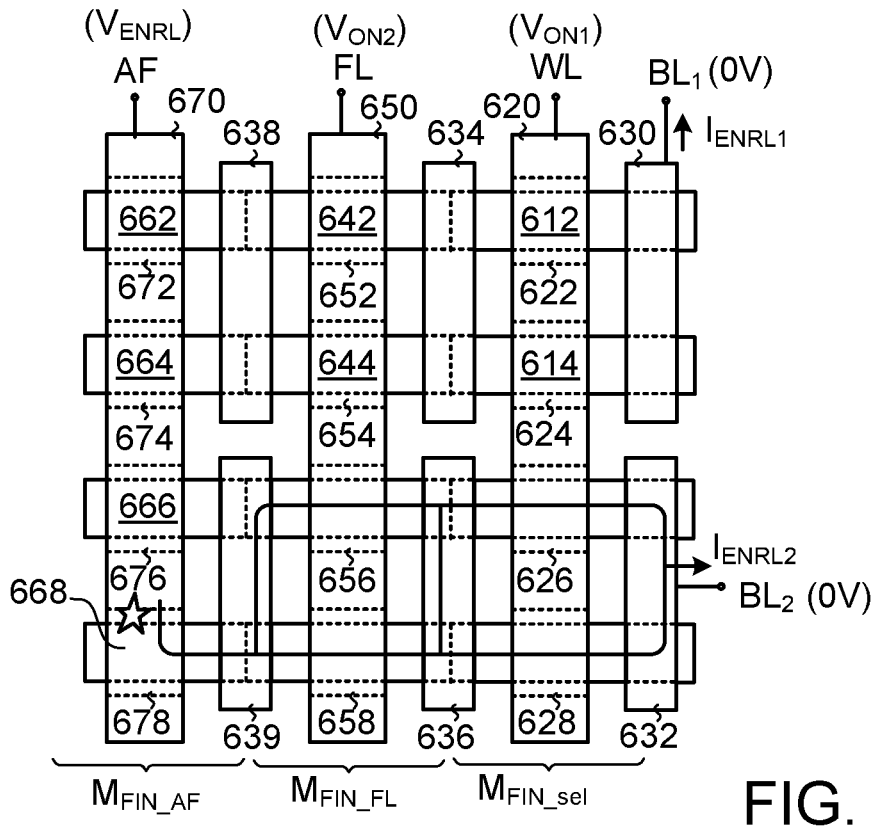
Figure 14C:
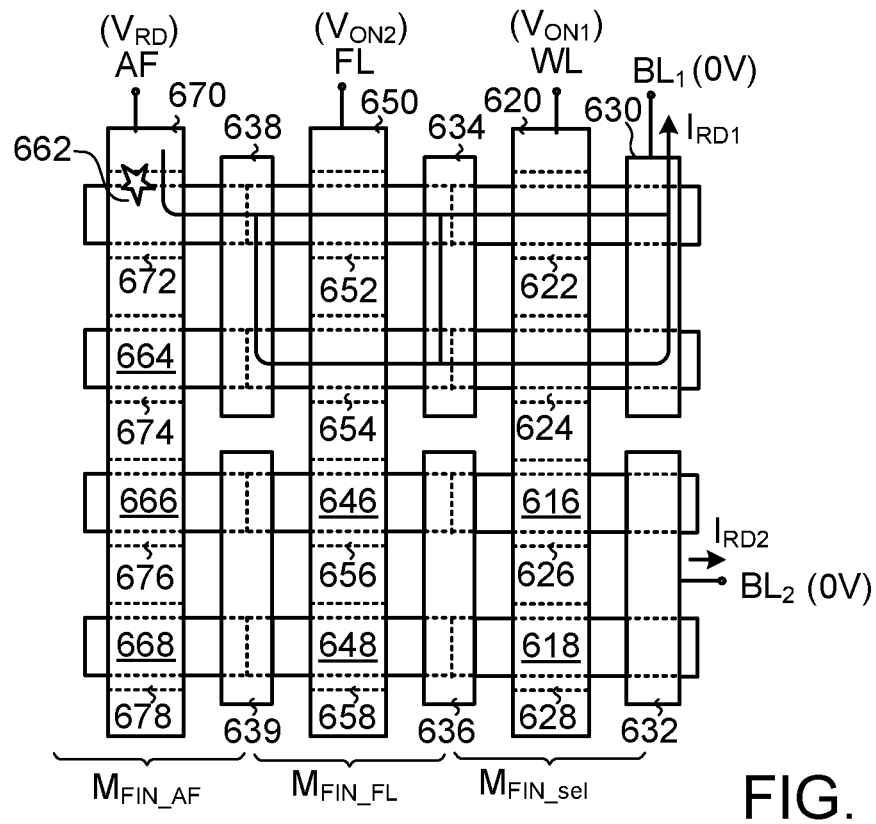
FIG. 14C and FIG. 14D schematically illustrate associated bias voltages for performing a read action on the OTP memory cell according to the ninth embodiment of the present invention.
Figure 14D:
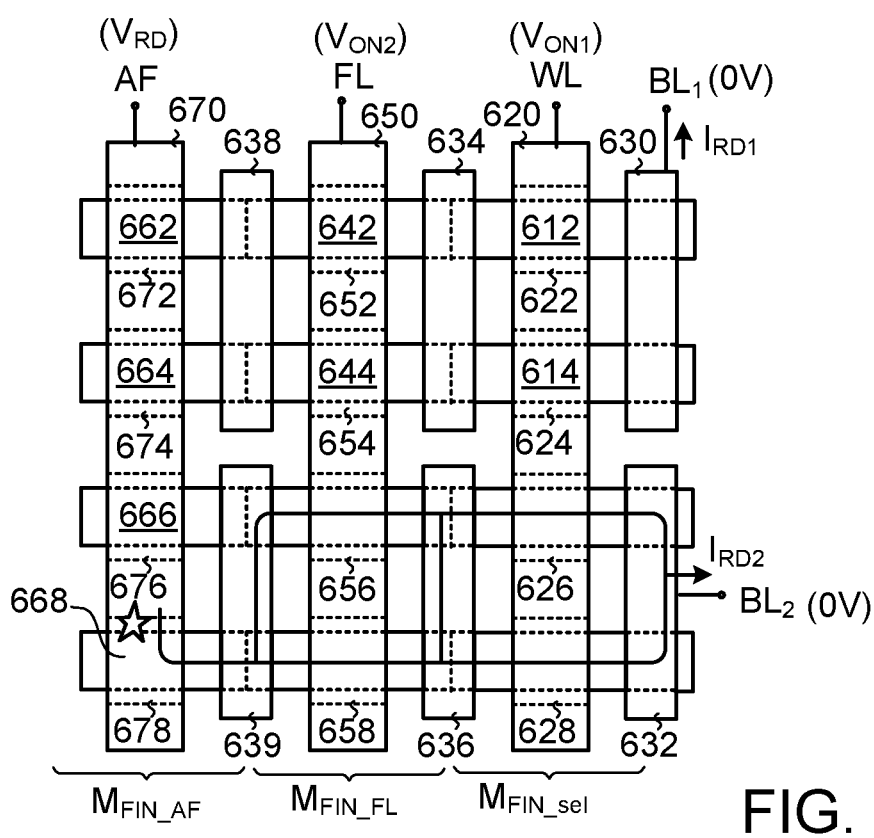

FIG. 14A and FIG. 14B schematically illustrate associated bias voltages for performing an enroll action on the OTP memory cell according to the ninth embodiment of the present invention. FIG. 14C and FIG. 14D schematically illustrate associated bias voltages for performing a read action on the OTP memory cell according to the ninth embodiment of the present invention.

When the enroll action is performed, the region between the first antifuse control line $AF_1$ and the first bit line $BL_1$ is a first enroll path, and the second antifuse control line $AF_2$ and the second bit line $BL_2$ is a second enroll path. Moreover, when the enroll action is performed, the first bit line $BL_1$ receives a ground voltage (0V), the word line WL receives a first on voltage $V_{ON1}$, the following control line FL receives a second on voltage $V_{ON2}$, and the second bit line $BL_2$ receives the ground voltage (0V). For example, the enroll voltage $V_{ENRL}$ is in the range between 3V and 6V, the first on voltage $V_{ON1}$ is in the range between 0.4V and 3V, and the second on voltage $V_{ON2}$ is in the range between 0.4V and 3V. Under this circumstance, the select transistor $M_{FIN\_sel}$ and the following transistor $M_{FIN\_FL}$ are turned on. That is, the first enroll path and the second enroll path are turned on.

Since the first transistor $M_{FIN\_sel}$ and the following transistor $M_{FIN\_FL}$ are turned on, the ground voltage (0V) of the first bit line $BL_1$ and the ground voltage (0V) of the second bit line $BL_2$ are transmitted to the drain/source contact layers 638 and 639 and the fins 662, 664, 666 and 668 of the antifuse transistor $M_{FIN\_AF}$ through the select transistor $M_{FIN\_sel}$ and the following transistor $M_{FIN\_FL}$. Consequently, when the antifuse control line AF receives the enroll voltage $V_{ENRL}$, the voltage stress between the fins 662, 664, 666 and 668 and the gate layer 670 of the antifuse transistor $M_{FIN\_AF}$ is equal to the enroll voltage $V_{ENRL}$. Under this circumstance, one of the four gate dielectric layers 672, 674, 676 and 678 is ruptured.

Due to the process variation of the OTP memory cell, it is unable to predict which of the gate dielectric layers 672, 674, 676 and 678 of the antifuse transistor $M_{FIN\_AF}$ is ruptured when the enroll action is performed. Consequently, the PUF technology can be applied to the OTP memory cell of the eighth embodiment.

For example, in the OTP memory cell as shown in FIG. 14A, the gate dielectric layer 672 of the antifuse transistor $M_{FIN\_AF}$ is ruptured after the enroll action is completed. Consequently, a first enroll current $I_{ENRL1}$ is generated. The first enroll current $I_{ENRL1}$ flows from the antifuse control line AF to the first bit line $BL_1$ through the gate layer 670, the gate dielectric layer 672, the fin 662, the drain/source contact layer 638 and the following transistor $M_{FIN\_FL}$. Since the gate dielectric layer 672 is ruptured, the region between the gate layer 670 and the fin 662 has a low resistance value. Moreover, since the gate dielectric layers 676 and 678 of the antifuse transistor $M_{FIN\_AF}$ are not ruptured, a second enroll current $I_{ENRL2}$ in the second bit line $BL_2$ is very low (e.g., nearly zero).

Similarly, if the gate dielectric layers 674 of the antifuse transistor $M_{FIN\_AF}$ is ruptured when the enroll action is performed, the magnitude of the first enroll current $I_{ENRL1}$ in the first bit line $BL_1$ is higher than the magnitude of the second enroll current $I_{ENRL2}$ in the second bit line $BL_2$.

Please refer to FIG. 14B. The gate dielectric layer 678 of the antifuse transistor $M_{FIN\_AF}$ is ruptured after the enroll action is completed. Consequently, a second enroll current $I_{ENRL2}$ is generated. The second enroll current $I_{ENRL2}$ flows from the antifuse control line AF to the second bit line $BL_2$ through the gate layer 670, the gate dielectric layer 678, the fin 668, the drain/source contact layer 639, the following transistor $M_{FIN\_FL}$ and the select transistor $M_{FIN\_sel}$. Since the gate dielectric layer 678 is ruptured, the region between the gate layer 670 and the fin 668 has a low resistance value. Moreover, since the gate dielectric layers 672 and 674 of the antifuse transistor $M_{FIN\_AF}$ are not ruptured, a first enroll current $I_{ENRL1}$ in the first bit line $BL_1$ is very low (e.g., nearly zero).

Similarly, if the gate dielectric layers 676 of the antifuse transistor $M_{FIN\_AF2}$ is ruptured when the enroll action is performed, the magnitude of the second enroll current $I_{ENRL2}$ in the second bit line $BL_2$ is higher than the magnitude of the first enroll current $I_{ENRL1}$ in the first bit line $BL_1$.

When the read action is performed, the region between the antifuse control line AF and the first bit line $BL_1$ is a first read path, and the antifuse control line AF and the second bit line $BL_2$ is a second read path. Moreover, when the read action is performed, the first bit line $BL_1$ receives the ground voltage (0V), the word line WL receives the first on voltage $V_{ON1}$, the following control line FL receives the second on voltage $V_{ON2}$, the antifuse control line AF receives a read voltage $V_{RD}$, and the second bit line $BL_2$ receives the ground voltage (0V). For example, the read voltage $V_{RD}$ is in the range between 0.75V and 1.2V. Under this circumstance, the select transistor $M_{FIN\_sel}$ and the following transistor $M_{FIN\_FL}$ are turned on. That is, the first read path and the second read path are turned on.

For example, in the OTP memory cell as shown in FIG. 14C, the gate dielectric layer 672 of the antifuse transistor $M_{FIN\_AF}$ is ruptured. When the read action is performed, a higher first read current $I_{RD1}$ flows from the antifuse control line AF to the first bit line $BL_1$ through the gate layer 670, the gate dielectric layer 672, the fin 662, the drain/source contact layer 638, the following transistor $M_{FIN\_FL}$ and the select transistor $M_{FIN\_sel}$. Moreover, since the gate dielectric layers 676 and 678 of the antifuse transistor $M_{FIN\_AF}$ are not ruptured, a second read current $I_{RD2}$ in the second bit line $BL_2$ is very low (e.g., nearly zero).

That is, if one of the other gate dielectric layers 672 and 674 of the antifuse transistor $M_{FIN\_AF}$ is ruptured when the read action is performed, the magnitude of the first read current $I_{RD1}$ in the first bit line $BL_1$ is higher than the magnitude of the second read current $I_{RD2}$ in the second bit line $BL_2$.

For example, in the OTP memory cell as shown in FIG. 14D, the gate dielectric layer 678 of the antifuse transistor $M_{FIN\_AF}$ is ruptured. When the read action is performed, a higher second read current $I_{RD2}$ flows from the antifuse control line AF to the second bit line $BL_2$ through the gate layer 670, the gate dielectric layer 678, the fin 668, the drain/source contact layer 639, the following transistor $M_{FIN\_FL}$ and the select transistor $M_{FIN\_sel}$. Moreover, since the gate dielectric layers 672 and 674 of the antifuse transistor $M_{FIN\_AF}$ are not ruptured, a first read current $I_{RD1}$ in the first bit line $BL_1$ is very low (e.g., nearly zero).

That is, if one of the other gate dielectric layers 676 and 678 of the antifuse transistor $M_{FIN\_AF}$ is ruptured when the read action is performed, the magnitude of the second read current $I_{RD2}$ in the second bit line $BL_2$ is higher than the magnitude of the first read current $I_{RD1}$ in the first bit line $BL_1$.

As mentioned above, the read action is performed after the enroll action is completed. When the read action is performed, one bit of a random code can be determined according to the magnitude of the first read current $I_{RD1}$ in the first bit line $BL_1$ and the magnitude of the second read current $I_{RD2}$ in the second bit line $BL_2$. For example, a current comparator is provided. The current comparator receives the first read current $I_{RD1}$ and the second read current $I_{RD2}$. If the magnitude of the first read current $I_{RD1}$ is higher than the magnitude of the second read current $I_{RD2}$, a first logic value (e.g., "0") is determined as the random code. Whereas, if the magnitude of the first read current $I_{RD1}$ is lower than the magnitude of the second read current $I_{RD2}$, a second logic value (e.g., "1") is determined as the random code.

Alternatively, when the read action is performed, one bit of a random code can be determined according to the magnitude of the first read current $I_{RD1}$ in the first bit line $BL_1$ or the magnitude of the second read current $I_{RD2}$ in the second bit line $BL_2$. For example, a current comparator is provided. The current comparator receives the first read current $I_{RD1}$ and the reference current Iref. If the magnitude of the first read current $I_{RD1}$ is higher than the magnitude of the reference current Iref, a first logic value (e.g., "0") is determined as the random code. Whereas, if the magnitude of the first read current $I_{RD1}$ is lower than the magnitude of the reference current Iref, a second logic value (e.g., "1") is determined as the random code.

In the OTP memory cell of the ninth embodiment, each of the select transistor $M_{FIN\_sel}$, the following transistor $M_{FIN\_FL}$, and the antifuse transistor $M_{FIN\_AF}$ has four fins. It is noted that numerous modifications and alterations may be made while retaining the teachings of the invention. For example, in some other embodiments, the select transistor $M_{FIN\_sel}$ has X fins, the following transistor $M_{FIN\_FL}$ has Y fins, and the antifuse transistor $M_{FIN\_AF}$ has Z fins.

For example, in a variant example of the OTP memory cell of the ninth embodiment, the select transistor $M_{FIN\_sel}$ has 2 fins (X=2), the following transistor $M_{FIN\_FL}$ has 2 fins (Y=2), and the antifuse transistor $M_{FIN\_AF}$ has 2 fins (Z=2). Due to this structural design, the antifuse-type OTP memory cell using the PUF technology has the smallest size.

From the above descriptions, the present invention provides a one time programming memory cell (OTP memory cell) with a fin field-effect (FinFET) transistor by using a physically unclonable function (PUF) technology. Each OTP memory cell can generate one bit of the random code. Moreover, plural OTP memory cells can be used to generate a unique identity code (ID code) of the semiconductor chip. For example, after 128 OTP memory cells are subjected to an enroll action and a read action sequentially, a 128-bit random code can be generated. By using the 128-bit random code, the data in the semiconductor chip can be effectively protected.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A one time programming (OTP) memory cell using a physically unclonable function technology, the OTP memory cell comprising:
   a first fin;
   a second fin;
   a first gate structure comprising a first gate dielectric layer, a second gate dielectric layer and a first gate layer, wherein a top surface and two lateral surfaces of a central region of the first fin are covered by the first gate dielectric layer, a top surface and two lateral surfaces of a central region of the second fin are covered by the second gate dielectric layer, the first gate dielectric layer and the second gate dielectric layer are covered by the first gate layer, and the first gate layer is connected with an antifuse control line;
   a first drain/source contact layer electrically connected with a first terminal of the first fin and a first terminal of the second fin;
   a second drain/source contact layer electrically connected with a second terminal of the second fin, wherein the second drain/source contact layer is not electrically connected with a second terminal of the first fin;
   a first transistor comprising a first drain/source terminal, a gate terminal and a second drain/source terminal, wherein the second drain/source terminal of the first transistor is connected with the first drain/source contact layer; and
   a second transistor comprising a first drain/source terminal, a gate terminal and a second drain/source terminal, wherein the first drain/source terminal of the second transistor is connected with the second drain/source contact layer.

2. The OTP memory cell as claimed in claim 1, wherein the first transistor is a first select transistor, and the second transistor is a second select transistor, wherein a first drain/source terminal of the first select transistor is connected with a first bit line, a gate terminal of the first select transistor is connected with a first word line, a second drain/source terminal of the first select transistor is connected with the first drain/source contact layer, a first drain/source terminal of the second select transistor is connected with the second drain/source contact layer, a gate terminal of the second select transistor is connected with a second word line, and a second drain/source terminal of the second select transistor is connected with a second bit line, wherein a region between the antifuse control line and the first bit line is an enroll path, and a region between the antifuse control line and the second bit line is a first read path.

3. The OTP memory cell as claimed in claim 2, wherein when an enroll action is performed, the enroll path is turned on, the first read path is turned off, the antifuse control line receives an enroll voltage, and the first bit line receives a ground voltage, so that one of the first gate dielectric layer and the second gate dielectric layer is ruptured.

4. The OTP memory cell as claimed in claim 3, wherein when a read action is performed, the enroll path is turned off, the first read path is turned on, the antifuse control line receives a read voltage, and the second bit line receives the ground voltage, so that the second bit line receives a read current, wherein a one-bit random code is determined according to a magnitude of the read current.

5. The OTP memory cell as claimed in claim 2, wherein the first select transistor comprises:
the first drain/source contact layer;
a third drain/source contact layer connected with the first bit line;
a third fin, wherein a first terminal of the third fin is electrically connected with the third drain/source contact layer, and a second terminal of the third fin is electrically connected with the first drain/source contact layer; and
a second gate structure comprising a third gate dielectric layer and a second gate layer, wherein a top surface and two lateral surfaces of a central region of the third fin are covered by the third gate dielectric layer, the third gate dielectric layer is covered by the second gate layer, and the second gate layer is connected with the first word line.

6. The OTP memory cell as claimed in claim 5, wherein the second select transistor comprises:
the second drain/source contact layer;
a fourth drain/source contact layer connected with the second bit line;
a fourth fin, wherein a first terminal of the fourth fin is electrically connected with the second drain/source contact layer, and a second terminal of the fourth fin is electrically connected with the fourth drain/source contact layer; and
a third gate structure comprising a fourth gate dielectric layer and a third gate layer, wherein a top surface and two lateral surfaces of a central region of the fourth fin are covered by the fourth gate dielectric layer, the fourth gate dielectric layer is covered by the third gate layer, and the third gate layer is connected with the second word line.

7. The OTP memory cell as claimed in claim 1, further comprising a first select transistor and a second select transistor, wherein the first transistor is a first following transistor, and the second transistor is a second following transistor, wherein a first drain/source terminal of the first select transistor is connected with a first bit line, a gate terminal of the first select transistor is connected with a first word line, a first drain/source terminal of the first following transistor is connected with a second drain/source terminal of the first select transistor, a gate terminal of the first following transistor is connected with a first following control line, a second drain/source terminal of the first following transistor is connected with the first drain/source contact layer, a first drain/source terminal of the second following transistor is connected with the second drain/source contact layer, a gate terminal of the second following transistor is connected with a second following control line, a first drain/source terminal of the second select transistor is connected with a second drain/source terminal of the second following transistor, a gate terminal of the second select transistor is connected with a second word line, and a second drain/source terminal of the second select transistor is connected with a second bit line, wherein a region between the antifuse control line and the first bit line is an enroll path, and a region between the antifuse control line and the second bit line is a first read path.

8. The OTP memory cell as claimed in claim 7, wherein when an enroll action is performed, the enroll path is turned on, the first read path is turned off, the antifuse control line receives an enroll voltage, and the first bit line receives a ground voltage, so that one of the first gate dielectric layer and the second gate dielectric layer is ruptured.

9. The OTP memory cell as claimed in claim 8, wherein when a read action is performed, the enroll path is turned off, the first read path is turned on, the antifuse control line receives a read voltage, and the second bit line receives the ground voltage, so that the second bit line receives a read current, wherein a one-bit random code is determined according to a magnitude of the read current.

10. The OTP memory cell as claimed in claim 7, wherein the first following transistor comprises:
the first drain/source contact layer;
a third drain/source contact layer;
a third fin, wherein a first terminal of the third fin is electrically connected with the third drain/source contact layer, and a second terminal of the third fin is electrically connected with the first drain/source contact layer; and
a second gate structure comprising a third gate dielectric layer and a second gate layer, wherein a top surface and two lateral surfaces of a central region of the third fin are covered by the third gate dielectric layer, the third gate dielectric layer is covered by the second gate layer, and the second gate layer is connected with the first following control line.

11. The OTP memory cell as claimed in claim 10, wherein the first select transistor comprises:
the third drain/source contact layer;
a fourth drain/source contact layer connected with the first bit line;
a fourth fin, wherein a first terminal of the fourth fin is electrically connected with the fourth drain/source contact layer, and a second terminal of the fourth fin is electrically connected with the third drain/source contact layer; and
a third gate structure comprising a fourth gate dielectric layer and a third gate layer, wherein a top surface and two lateral surfaces of a central region of the fourth fin are covered by the fourth gate dielectric layer, the fourth gate dielectric layer is covered by the third gate layer, and the third gate layer is connected with the first word line.

12. The OTP memory cell as claimed in claim 11, wherein the second following transistor comprises:
the second drain/source contact layer;
a fifth drain/source contact layer;
a fifth fin, wherein a first terminal of the fifth fin is electrically connected with the second drain/source contact layer, and a second terminal of the fifth fin is electrically connected with the fifth drain/source contact layer; and a fourth gate structure comprising a fifth gate dielectric layer and a fourth gate layer, wherein a top surface and two lateral surfaces of a central region of the fifth fin are covered by the fifth gate dielectric layer, the fifth gate dielectric layer is covered by the fourth gate layer, and the fourth gate layer is connected with the second following control line.

13. The OTP memory cell as claimed in claim 12, wherein the second select transistor comprises:
   the fifth drain/source contact layer;
   a sixth drain/source contact layer connected with the second bit line;
   a sixth fin, wherein a first terminal of the sixth fin is electrically connected with the fifth drain/source contact layer, and a second terminal of the sixth fin is electrically connected with the sixth drain/source contact layer; and
   a fifth gate structure comprising a sixth gate dielectric layer and a fifth gate layer, wherein a top surface and two lateral surfaces of a central region of the sixth fin are covered by the sixth gate dielectric layer, the sixth gate dielectric layer is covered by the fifth gate layer, and the fifth gate layer is connected with the second word line.

14. A one time programming (OTP) memory cell using a physically unclonable function technology, the OTP memory cell comprising:
   a first drain/source contact layer;
   a first fin, wherein a first terminal of the first fin is electrically connected with the first drain/source contact layer;
   a second fin, wherein a first terminal of the second fin is electrically connected with the first drain/source contact layer;
   a first gate structure comprising a first gate dielectric layer, a second gate dielectric layer and a first gate layer, wherein a top surface and two lateral surfaces of a central region of the first fin are covered by the first gate dielectric layer, a top surface and two lateral surfaces of a central region of the second fin are covered by the second gate dielectric layer, and the first gate dielectric layer and the second gate dielectric layer are covered by the first gate layer;
   a second drain/source contact layer;
   a third fin, wherein a first terminal of the third fin is electrically connected with a second terminal of the first fin, and a second terminal of the third fin is not electrically connected with the second drain/source contact layer;
   a fourth fin, wherein a first terminal of the fourth fin is electrically connected with a second terminal of the second fin, and a second terminal of the fourth fin is electrically connected with the second drain/source contact layer;
   a second gate structure comprising a third gate dielectric layer, a fourth gate dielectric layer and a second gate layer, wherein a top surface and two lateral surfaces of a central region of the third fin are covered by the third gate dielectric layer, a top surface and two lateral surfaces of a central region of the fourth fin are covered by the fourth gate dielectric layer, the third gate dielectric layer and the fourth gate dielectric layer are covered by the second gate layer, and the second gate layer is electrically connected with an antifuse control line;
   a third drain/source contact layer;
   a fifth fin, wherein a first terminal of the fifth fin is electrically connected with the second drain/source contact layer, and a second terminal of the fifth fin is electrically connected with the third drain/source contact layer; and
   a third gate structure comprising a fifth gate dielectric layer and a third gate layer, wherein a top surface and two lateral surfaces of a central region of the fifth fin are covered by the fifth gate dielectric layer, and the fifth gate dielectric layer is covered by the third gate layer.

15. The OTP memory cell as claimed in claim 14, wherein the first drain/source contact layer is connected with a first bit line, the first gate layer is connected with a first word line, the third drain/source contact layer is connected with a second bit line, and the third gate layer is connected with a second word line, wherein a region between the antifuse control line and the first bit line is an enroll path, and a region between the antifuse control line and the second bit line is a first read path.

16. The OTP memory cell as claimed in claim 15, wherein when an enroll action is performed, the enroll path is turned on, the first read path is turned off, the antifuse control line receives an enroll voltage, and the first bit line receives a ground voltage, so that one of the third gate dielectric layer and the fourth gate dielectric layer is ruptured.

17. The OTP memory cell as claimed in claim 16, wherein when a read action is performed, the enroll path is turned off, the first read path is turned on, the antifuse control line receives a read voltage, and the second bit line receives the ground voltage, so that the second bit line receives a read current, wherein a one-bit random code is determined according to a magnitude of the read current.

18. The OTP memory cell as claimed in claim 15, further comprising:
   a fourth drain/source contact layer electrically connected with the second terminal of the first fin, the second terminal of the second fin, the first terminal of the third fin and the first terminal of the fourth fin; and
   a sixth fin, wherein a first terminal of the sixth fin is electrically connected with the second terminal of the third fin,
   wherein the third gate structure further comprises a sixth gate dielectric layer, wherein a top surface and two lateral surfaces of a central region of the sixth fin are covered by the sixth gate dielectric layer, and the sixth gate dielectric layer is covered by the third gate layer.

19. The OTP memory cell as claimed in claim 14, further comprising:
   a fourth drain/source contact layer;
   a sixth fin, wherein a first terminal of the sixth fin is electrically connected with the fourth drain/source contact layer, and a second terminal of the sixth fin is electrically connected with the first drain/source contact layer;
   a fourth gate structure comprising a sixth gate dielectric layer and a fourth gate layer, wherein a top surface and two lateral surfaces of a central region of the sixth fin are covered by the sixth gate dielectric layer, and the sixth gate dielectric layer is covered by the fourth gate layer;
   a fifth drain/source contact layer;
   a seventh fin, wherein a first terminal of the seventh fin is electrically connected with the third drain/source contact layer, and a second terminal of the seventh fin is electrically connected with the fifth drain/source contact layer; and
   a fifth gate structure comprising a seventh gate dielectric layer and a fifth gate layer, wherein a top surface and two lateral surfaces of a central region of the seventh fin are covered by the seventh gate dielectric layer, and the seventh gate dielectric layer is covered by the fifth gate layer.

20. The OTP memory cell as claimed in claim 19, wherein the fourth drain/source contact layer is connected with a first bit line, the fourth gate layer is connected with a first word line, the first gate layer is connected with a first following control line, the third gate layer is connected with a second following control line, the fifth drain/source contact layer is connected with a second bit line, and the fifth gate layer is connected with a second word line, wherein a region between the antifuse control line and the first bit line is an enroll path, and a region between the antifuse control line and the second bit line is a first read path.

21. The OTP memory cell as claimed in claim 20, wherein when an enroll action is performed, the enroll path is turned on, the first read path is turned off, the antifuse control line receives an enroll voltage, and the first bit line receives a ground voltage, so that one of the third gate dielectric layer and the fourth gate dielectric layer is ruptured.

22. The OTP memory cell as claimed in claim 21, wherein when a read action is performed, the enroll path is turned off, the first read path is turned on, the antifuse control line receives a read voltage, and the second bit line receives the ground voltage, so that the second bit line receives a read current, wherein a one-bit random code is determined according to a magnitude of the read current.

23. The OTP memory cell as claimed in claim 22, further comprising:
 a sixth drain/source contact layer electrically connected with the second terminal of the first fin, the second terminal of the second fin, the first terminal of the third fin and the first terminal of the fourth fin; and
 an eighth fin, wherein a first terminal of the eighth fin is electrically connected with the second terminal of the third fin, and a second terminal of the eighth fin is not electrically connected with the third drain/source contact layer,
 wherein the third gate structure further comprises an eighth gate dielectric layer, wherein a top surface and two lateral surfaces of a central region of the eighth fin are covered by the eighth gate dielectric layer, and the eighth gate dielectric layer is covered by the third gate layer.

24. The OTP memory cell as claimed in claim 23, further comprising:
 a ninth fin, wherein a first terminal of the ninth fin is electrically connected with the second terminal of the eighth fin, and a second terminal of the ninth fin is not electrically connected with the fifth drain/source contact layer,
 wherein the fifth gate structure further comprises a ninth gate dielectric layer, wherein a top surface and two lateral surfaces of a central region of the ninth fin are covered by the ninth gate dielectric layer, and the ninth gate dielectric layer is covered by the fifth gate layer.

25. A one time programming (OTP) memory cell using a physically unclonable function technology, the OTP memory cell comprising:
 a first transistor comprising a first drain/source terminal, a gate terminal and a second drain/source terminal;
 a first fin, wherein a first terminal of the first fin is electrically connected with the second drain/source terminal of the first transistor;
 a first gate structure comprising a first gate dielectric layer and a first gate layer, wherein a top surface and two lateral surfaces of a central region of the first fin are covered by the first gate dielectric layer, the first gate dielectric layer is covered by the first gate layer, and the first gate layer is connected with a first antifuse control line;
 a second fin, wherein a first terminal of the second fin is electrically connected with a second terminal of the first fin;
 a second gate structure comprising a second gate dielectric layer and a second gate layer, wherein a top surface and two lateral surfaces of a central region of the second fin are covered by the second gate dielectric layer, the second gate dielectric layer is covered by the second gate layer, and the second gate layer is connected with a second antifuse control line; and
 a second transistor comprising a first drain/source terminal, a gate terminal and a second drain/source terminal, wherein the first drain/source terminal of the second transistor is connected with a second terminal of the second fin.

26. The OTP memory cell as claimed in claim 25, wherein the first transistor is a first select transistor, and the second transistor is a second select transistor, wherein a first drain/source terminal of the first select transistor is connected with a first bit line, a gate terminal of the first select transistor is connected with a first word line, a gate terminal of the second select transistor is connected with a second word line, and a second drain/source terminal of the second select transistor is connected with a second bit line.

27. The OTP memory cell as claimed in claim 26, wherein when an enroll action is performed, a first enroll path between the first antifuse control line and the first bit line and a second enroll path between the second antifuse control line and the second bit line are turned on, the first antifuse control line receives an enroll voltage, the second antifuse control line receives the enroll voltage, the first bit line receives a ground voltage, and the second bit line receives the ground voltage, so that one of the first gate dielectric layer and the second gate dielectric layer is ruptured.

28. The OTP memory cell as claimed in claim 27, wherein when a read action is performed, a first read path between the first antifuse control line and the first bit line and a second read path between the second antifuse control line and the second bit line are turned on, the first antifuse control line receives a read voltage, the second antifuse control line receives the read voltage, the first bit line receives the ground voltage, and the second bit line receives the ground voltage, so that the first bit line receives a first read current and the second bit line receives a second read current, wherein a one-bit random code is determined according to a magnitude of the first read current and a magnitude of the second read current.

29. The OTP memory cell as claimed in claim 27, wherein when a read action is performed, a first read path between the first antifuse control line and the first bit line is turned on, the first antifuse control line receives a read voltage, and the first bit line receives the ground voltage, so that the first bit line receives a first read current, wherein a one-bit random code is determined according to a magnitude of the first read current.

30. The OTP memory cell as claimed in claim 26, wherein the first select transistor comprises:
 a first drain/source contact layer connected with the first bit line;
 a third fin, wherein a first terminal of the third fin is electrically connected with the first drain/source contact layer;

a third gate structure comprising a third gate dielectric layer and a third gate layer, wherein a top surface and two lateral surfaces of a central region of the third fin are covered by the third gate dielectric layer, the third gate dielectric layer is covered by the third gate layer, and the third gate layer is connected with the first word line; and a second drain/source contact layer electrically connected with a second terminal of the third fin and the first terminal of the first fin.

31. The OTP memory cell as claimed in claim 30, wherein the second select transistor comprises:

a third drain/source contact layer connected with the second terminal of the second fin;

a fourth fin, wherein a first terminal of the fourth fin is electrically connected with the third drain/source contact layer;

a fourth gate structure comprising a fourth gate dielectric layer and a fourth gate layer, wherein a top surface and two lateral surfaces of a central region of the fourth fin are covered by the fourth gate dielectric layer, the fourth gate dielectric layer is covered by the fourth gate layer, and the fourth gate layer is connected with the second word line;

a fourth drain/source contact layer electrically connected with a second terminal of the fourth fin, wherein the fourth drain/source contact layer is connected with the second bit line; and a fifth drain/source contact layer electrically connected with a second terminal of the first fin and the first terminal of the second fin.

32. A one time programming (OTP) memory cell using a physically unclonable function technology, the OTP memory cell comprising:

a first drain/source contact layer connected with a first bit line;

a second drain/source contact layer connected with a second bit line;

a first fin, wherein a first terminal of the first fin is electrically connected with the first drain/source contact layer;

a second fin, wherein a first terminal of the second fin is electrically connected with the second drain/source contact layer;

a first gate structure comprising a first gate dielectric layer, a second gate dielectric layer and a first gate layer, wherein a top surface and two lateral surfaces of a central region of the first fin are covered by the first gate dielectric layer, a top surface and two lateral surfaces of a central region of the second fin are covered by the second gate dielectric layer, the first gate dielectric layer and the second gate dielectric layer are covered by the first gate layer, and the first gate layer is connected with a word line;

a third fin, wherein a first terminal of the third fin is electrically connected with a second terminal of the first fin;

a fourth fin, wherein a first terminal of the fourth fin is electrically connected with a second terminal of the second fin;

a second gate structure comprising a third gate dielectric layer, a fourth gate dielectric layer and a second gate layer, wherein a top surface and two lateral surfaces of a central region of the third fin are covered by the third gate dielectric layer, a top surface and two lateral surfaces of a central region of the fourth fin are covered by the fourth gate dielectric layer, the third gate dielectric layer and the fourth gate dielectric layer are covered by the second gate layer, and the second gate layer is connected with a following control line;

a fifth fin, wherein a first terminal of the fifth fin is electrically connected with a second terminal of the third fin;

a sixth fin, wherein a first terminal of the sixth fin is electrically connected with a second terminal of the fourth fin; and a third gate structure comprising a fifth gate dielectric layer, a sixth gate dielectric layer and a third gate layer, wherein a top surface and two lateral surfaces of a central region of the fifth fin are covered by the fifth gate dielectric layer, a top surface and two lateral surfaces of a central region of the sixth fin are covered by the sixth gate dielectric layer, the fifth gate dielectric layer and the sixth gate dielectric layer are covered by the third gate layer, and the third gate layer is connected with an antifuse control line.

33. The OTP memory cell as claimed in claim 32, further comprising:

a third drain/source contact layer electrically connected with the second terminal of the first fin and the first terminal of the third fin;

a fourth drain/source contact layer electrically connected with the second terminal of the second fin and the first terminal of the fourth fin;

a fifth drain/source contact layer electrically connected with the second terminal of the third fin and the first terminal of the fifth fin; and a sixth drain/source contact layer electrically connected with the second terminal of the fourth fin and the first terminal of the sixth fin.

34. The OTP memory cell as claimed in claim 32, wherein when an enroll action is performed, a first enroll path between the antifuse control line and the first bit line and a second enroll path between the antifuse control line and the second bit line are turned on, the antifuse control line receives an enroll voltage, the first bit line receives a ground voltage, and the second bit line receives the ground voltage, so that one of the first gate dielectric layer and the second gate dielectric layer is ruptured.

35. The OTP memory cell as claimed in claim 34, wherein when a read action is performed, a first read path between the antifuse control line and the first bit line and a second read path between the antifuse control line and the second bit line are turned on, the antifuse control line receives a read voltage, the first bit line receives the ground voltage, and the second bit line receives the ground voltage, so that the first bit line receives a first read current and the second bit line receives a second read current, wherein a one-bit random code is determined according to a magnitude of the first read current and a magnitude of the second read current.

36. The OTP memory cell as claimed in claim 34, wherein when a read action is performed, a first read path between the antifuse control line and the first bit line is turned on, the antifuse control line receives a read voltage, and the first bit line receives the ground voltage, so that the first bit line receives a first read current, wherein a one-bit random code is determined according to a magnitude of the first read current.

* * * * *